(12) United States Patent
Watanabe et al.

(10) Patent No.: US 10,381,292 B2
(45) Date of Patent: Aug. 13, 2019

(54) LEAD FRAME AND METHOD OF MANUFACTURING LEAD FRAME

(71) Applicant: SHINKO ELECTRIC INDUSTRIES CO., LTD., Nagano (JP)

(72) Inventors: Koji Watanabe, Nagano (JP); Kentaro Kaneko, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 16/106,460

(22) Filed: Aug. 21, 2018

(65) Prior Publication Data

US 2019/0074242 A1    Mar. 7, 2019

(30) Foreign Application Priority Data

Sep. 6, 2017 (JP) ................................. 2017-171314

(51) Int. Cl.
*H01L 23/495* (2006.01)
*H01L 23/00* (2006.01)
(Continued)

(52) U.S. Cl.
CPC .... *H01L 23/49503* (2013.01); *H01L 21/4825* (2013.01); *H01L 21/4828* (2013.01); *H01L 21/4832* (2013.01); *H01L 21/561* (2013.01); *H01L 23/49541* (2013.01); *H01L 23/49582* (2013.01); *H01L 24/33* (2013.01); *H01L 23/49548* (2013.01); *H01L 23/49572* (2013.01); *H01L 24/13* (2013.01); *H01L 24/16* (2013.01); *H01L 24/29* (2013.01); *H01L 24/32* (2013.01); *H01L 24/48* (2013.01); *H01L 24/49* (2013.01); *H01L 24/73* (2013.01); *H01L 24/81* (2013.01); *H01L 24/83* (2013.01); *H01L 24/85* (2013.01); *H01L 24/92* (2013.01); *H01L 24/97* (2013.01);
(Continued)

(58) Field of Classification Search
CPC ........... H01L 23/49582; H01L 21/4842; H01L 21/304; H01L 23/49541; H01L 23/49548
USPC ....................................... 257/666, 676, 669
See application file for complete search history.

(56) References Cited

U.S. PATENT DOCUMENTS 7,946,022 B2     5/2011  Uno et al.
7,981,770 B2 *   7/2011  Kaneko ............. B23K 26/0853
                                                       438/463
(Continued)

FOREIGN PATENT DOCUMENTS

JP    H07-176669    7/1995
JP    2007-039804   2/2007

*Primary Examiner* — S. V. Clark
(74) *Attorney, Agent, or Firm* — IPUSA, PLLC

(57) ABSTRACT

A lead frame includes a plate portion provided with a first surface and a second surface, the second surface being opposite to the first surface; a protruding portion integrally formed with the plate portion to be protruded from the first surface of the plate portion, wherein a surface of the lead frame includes a work affected layer existing region at which a work affected layer is formed, and a work affected layer non-existing region at which a work affected layer is not formed, wherein a front end surface of the protruding portion is the work affected layer existing region, wherein a region of the first surface at which the protruding portion is not formed is the work affected layer non-existing region, and wherein the second surface of the plate portion includes the work affected layer non-existing region.

6 Claims, 25 Drawing Sheets

(51) Int. Cl.
*H01L 21/48* (2006.01)
*H01L 21/56* (2006.01)

(52) U.S. Cl.
CPC .......... *H01L 2224/0401* (2013.01); *H01L 2224/04042* (2013.01); *H01L 2224/131* (2013.01); *H01L 2224/16245* (2013.01); *H01L 2224/2919* (2013.01); *H01L 2224/32245* (2013.01); *H01L 2224/45144* (2013.01); *H01L 2224/45147* (2013.01); *H01L 2224/48091* (2013.01); *H01L 2224/49112* (2013.01); *H01L 2224/73265* (2013.01); *H01L 2224/81005* (2013.01); *H01L 2224/81439* (2013.01); *H01L 2224/81444* (2013.01); *H01L 2224/83855* (2013.01); *H01L 2224/85005* (2013.01); *H01L 2224/85439* (2013.01); *H01L 2224/85444* (2013.01); *H01L 2224/92247* (2013.01); *H01L 2224/97* (2013.01); *H01L 2924/18161* (2013.01); *H01L 2924/18165* (2013.01); *H01L 2924/3511* (2013.01)

(56) References Cited

U.S. PATENT DOCUMENTS

| 2006/0211220 A1* | 9/2006 | Sakaya | B28D 5/0011 |
| | | | 438/464 |
| 2007/0015001 A1* | 1/2007 | Uno | C25D 5/34 |
| | | | 428/655 |
| 2009/0011572 A1* | 1/2009 | Kaneko | B23K 26/0853 |
| | | | 438/463 |

* cited by examiner

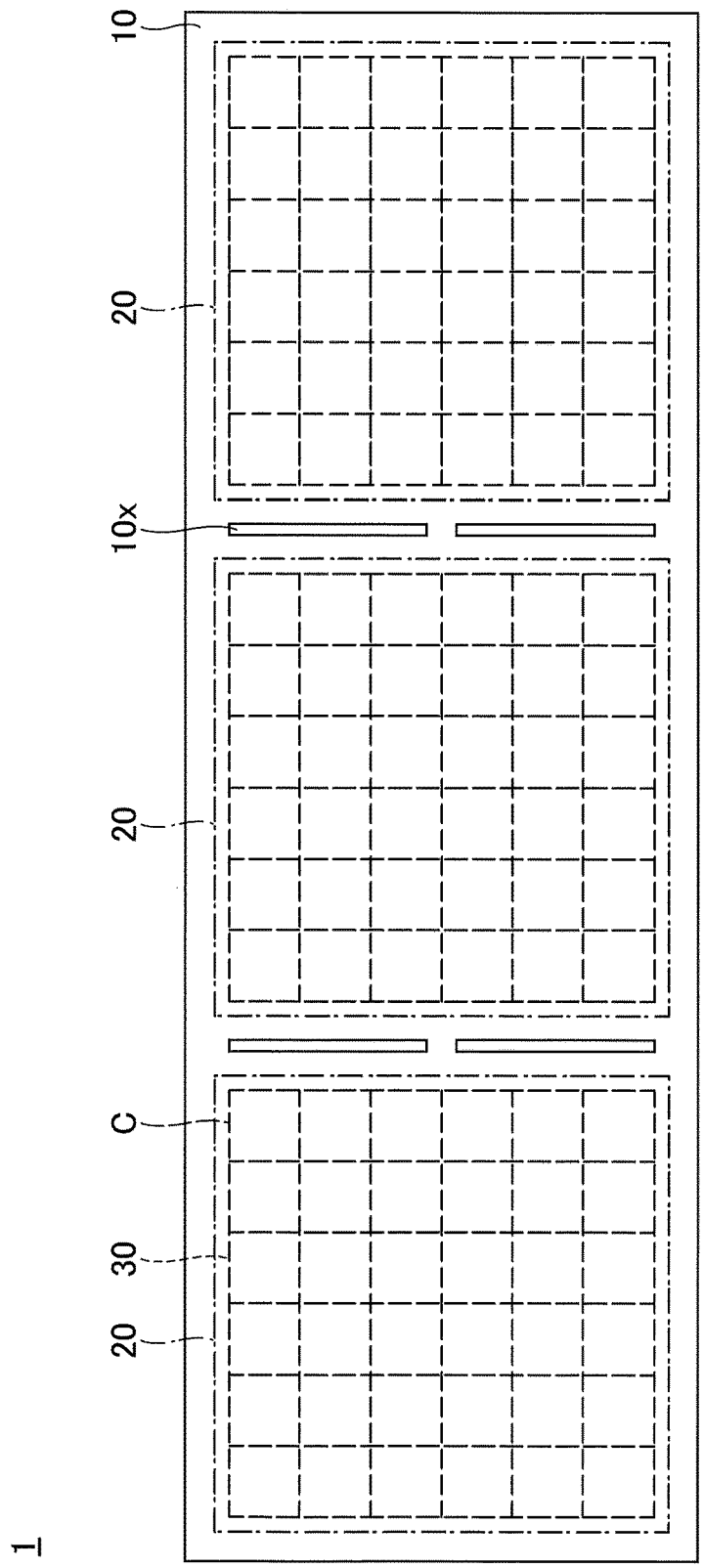

FIG.19A
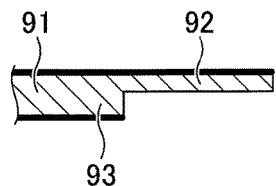 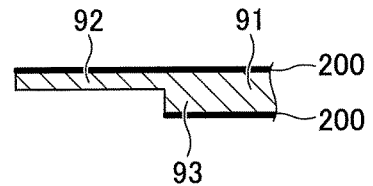
FIG.19B
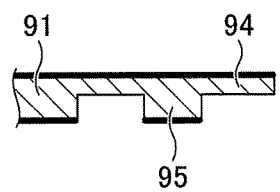 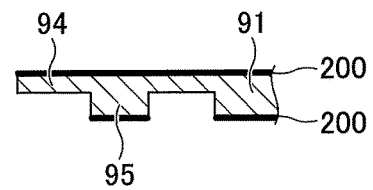
FIG.19C
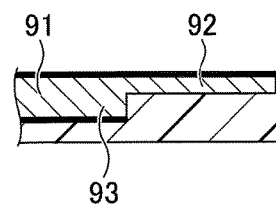 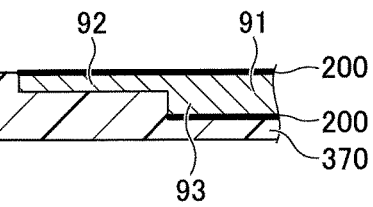
FIG.19D
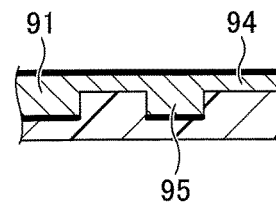 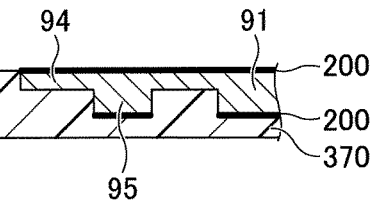

FIG.25A
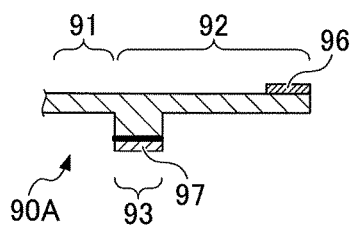 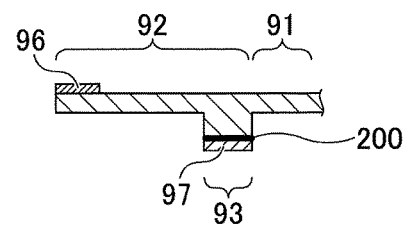
FIG.25B
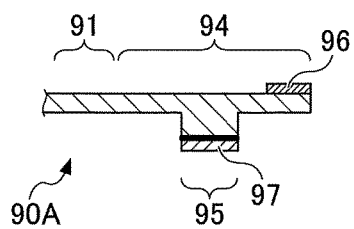 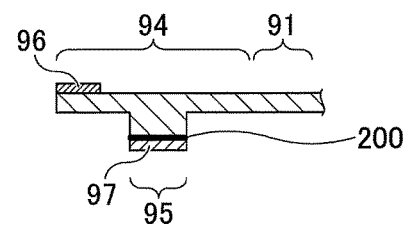

LEAD FRAME AND METHOD OF MANUFACTURING LEAD FRAME

CROSS-REFERENCE TO RELATED APPLICATIONS

The present application is based on and claims the benefit of priority of Japanese Priority Application No. 2017-171314 filed on Sep. 6, 2017, the entire contents of which are hereby incorporated by reference.

FIELD

The present invention relates to a lead frame and a method of manufacturing a lead frame.

BACKGROUND

In a rolled metal material such as a rolled copper alloy, a work affected layer (a layer in which metal crystal grains are finely formed compared with crystal grains inside the metal) is formed at a surface due to strong stress applied to the surface by a reduction roll during working. Then, most of deformation caused by internal stress is accumulated in the work affected layer as residual stress.

When the work affected layers in which residual stress is accumulated are equally formed at both surfaces of a metal material, the metal material can retain flatness as a plate material. However, if working by which the work affected layer at one side is partially or entirely removed is performed, the residual stresses at the both surfaces become unbalanced and the metal material becomes warped, that becomes an obstacle in manufacturing a lead frame.

PATENT DOCUMENTS

Patent Document 1: Japanese Laid-open Patent Publication No. 2007-039804
Patent Document 2: Japanese Laid-open Patent Publication No. H07-176669

SUMMARY

The present invention is made in light of the above problems, and to reduce warpage of a lead frame.

According to an embodiment, there is provided a lead frame including a plate portion provided with a first surface and a second surface, the second surface being opposite to the first surface; a protruding portion integrally formed with the plate portion to be protruded from the first surface of the plate portion, wherein a surface of the lead frame includes a work affected layer existing region at which a work affected layer is formed, and a work affected layer non-existing region at which a work affected layer is not formed, wherein a front end surface of the protruding portion is the work affected layer existing region, wherein a region of the first surface at which the protruding portion is not formed is the work affected layer non-existing region, and wherein the second surface of the plate portion includes the work affected layer non-existing region.

BRIEF DESCRIPTION OF DRAWINGS

Other objects, features and advantages of the present invention will become more apparent from the following detailed description when read in conjunction with the accompanying drawings.

FIG. 1 is a plan view illustrating an example of a lead frame of a first embodiment;

FIG. 19A to FIG. 19D are views illustrating an example of the manufacturing steps of the lead frame of the second embodiment;

FIG. 25A and FIG. 25B are views illustrating a unit lead frame constituting a lead frame of a modified example of the second embodiment.

DESCRIPTION OF EMBODIMENTS

Figure 2A:
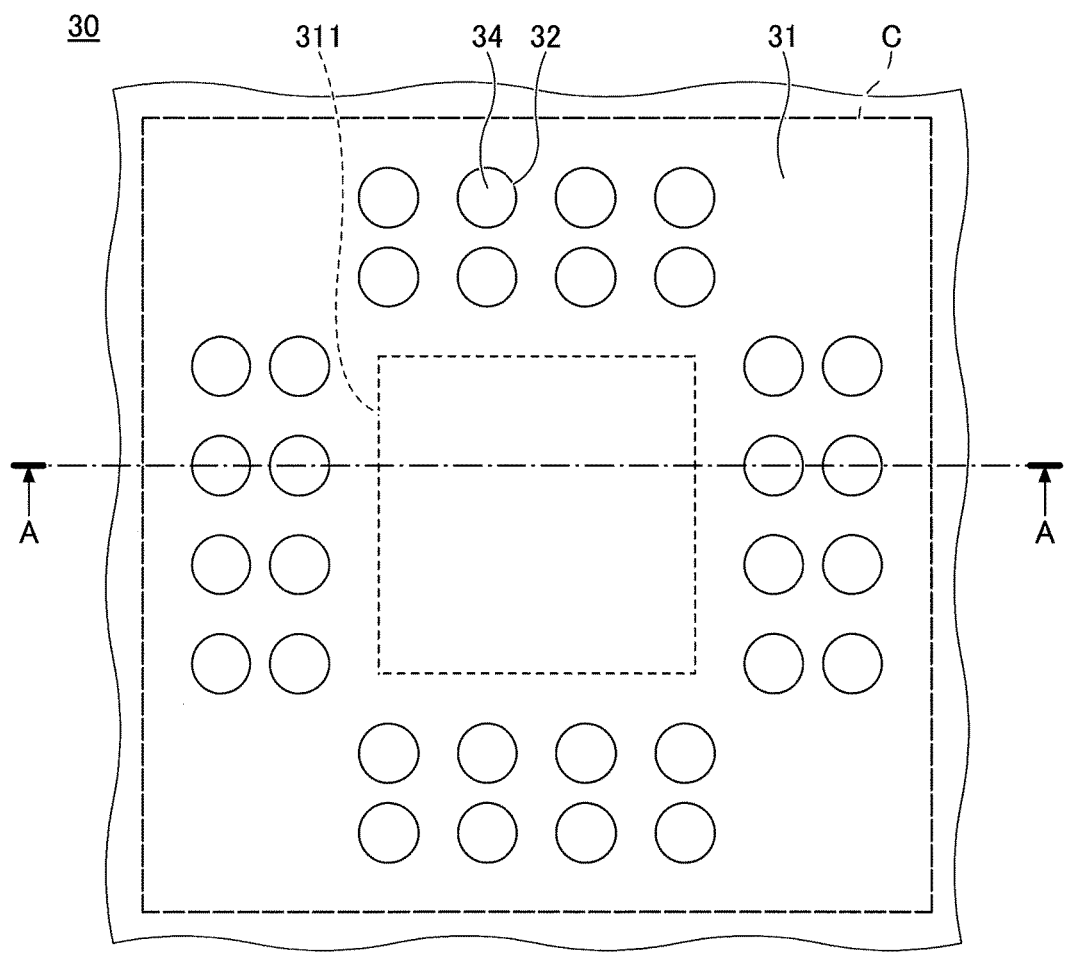
FIG. 2A and FIG. 2B are views illustrating an example of a structure of a unit lead frame constituting the lead frame of the first embodiment.

The invention will be described herein with reference to illustrative embodiments. Those skilled in the art will recognize that many alternative embodiments can be accomplished using the teachings of the present invention and that the invention is not limited to the embodiments illustrated for explanatory purposes.

It is to be noted that, in the explanation of the drawings, the same components are given the same reference numerals, and explanations are not repeated.

First Embodiment (Structure of Lead Frame)

FIG. 1 is a plan view illustrating an example of a lead frame 1 of a first embodiment. The lead frame 1 includes a substrate frame 10 having a substantially rectangular shape in a planar view, and a plurality of unit lead frame groups 20 that are aligned on the substrate frame 10 with spaces therebetween.

Although the three unit lead frame groups 20 are aligned in a raw in an example of FIG. 1, the number of the unit lead frame groups 20 may be freely determined. Further, a plurality of the rows of the unit lead frame groups 20 may be aligned in a column. Although slits 10x are provided between the adjacent unit lead frame groups 20, this is not essential.

As a material of the lead frame 1, for example, copper (Cu), Cu-based alloy, iron-nickel (Fe—Ni), Fe—Ni-based alloy, stainless steel or the like may be used.

Each of the unit lead frame groups 20 includes a plurality of unit lead frames 30 aligned in a matrix manner. The unit lead frame 30 is an area on which a semiconductor chip is mounted, that is cut by cut positions "C" and that becomes a part of a semiconductor device. Although each of the unit lead frame groups 20 is constituted by the unit lead frames 30 that are aligned in 6 rows and 6 columns in an example of FIG. 1, the number of the unit lead frames 30 constituting each of the unit lead frame groups 20 may be freely determined.

Figure 2B:
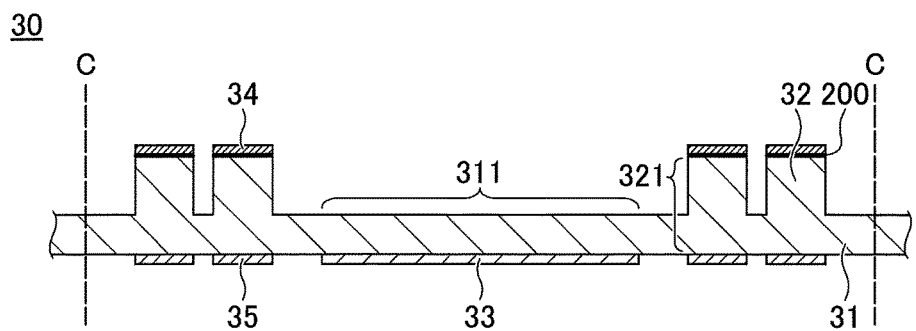

FIG. 2A and FIG. 2B are views illustrating an example of a structure of the unit lead frame 30 constituting the lead frame 1 of the first embodiment. FIG. 2A is a plan view, and FIG. 2B is a cross-sectional view taken along an A-A line of FIG. 2A.

With reference to FIG. 2A and FIG. 2B, the unit lead frame 30 includes a plate portion 31, and a plurality of protruding portions 32 that are integrally formed with the plate portion 31. The plate portion 31 includes a chip mounting portion 311. When a semiconductor chip is mounted on the unit lead frame 30 and the unit lead frame 30 is individualized, the chip mounting portion 311 becomes a die pad on which the semiconductor chip is mounted in a semiconductor device. The thickness of the plate portion 31 may be, for example, approximately 20 to 60 µm. The height of the protruding portion 32 (a protruding amount from an upper surface of the plate portion 31) may be, for example, approximately 60 to 90 µm. The unit lead frame 30 is a one side half-etched type lead frame including columnar connection terminals.

In this embodiment, a side of the unit lead frame 30 at which the protruding portions 32 are formed is referred to as an upper side or one side, and a side of the unit lead frame 30 at which the protruding portions 32 are not formed is referred to as a lower side or the other side. Further, a surface of each component at the side at which the protruding portions 32 are formed is referred to as one surface or an upper surface, and a surface of each component at the side at which the protruding portions 32 are not formed is referred to as the other surface or a lower surface. However, the unit lead frame 30 may be used in an opposite direction or may be used at an arbitrary angle. Further, in this embodiment, "in a planar view" means that an object is seen in a direction that is normal to one surface of the plate portion 31, and a "planar shape" means a shape of an object seen in the direction that is normal to the one surface of the plate portion 31.

The protruding portion 32 is formed at an upper surface of the plate portion 31 to cylindrically protrude, for example. Alternatively, the protruding portion 32 may have a polygonal pillar shape such as a square pillar shape or a hexagonal pillar shape. A plurality of the protruding portions 32 are provided around the chip mounting portion 311 with a predetermined pitch in a planar view, for example. In the example illustrated in FIG. 2A, two columns of the protruding portions 32 are provided along each side of the chip mounting portion 311. However, the protruding portions 32 may not be provided in two columns around the chip mounting portion 311, and one column of the protruding portions 32 may be provided, or three of more columns of the protruding portions 32 may be provided. Further, the protruding portions 32 may be provided at only two opposing sides, among the four sides, of the chip mounting portion 311.

The protruding portion 32 and a portion of the plate portion 31 that overlaps the protruding portion 32 in a planar view constitute a connection terminal 321. The connection terminal 321 is electrically independent from the chip mounting portion 311, is electrically connected to a semiconductor chip, and is capable of being connected to an external portion of a semiconductor device, in the semiconductor device formed by mounting the semiconductor chip on the unit lead frame 30 and individualizing the unit lead frame 30.

A metal film 33 is formed at a lower surface of the chip mounting portion 311. A metal film 34 is formed at an upper surface of each of the connection terminals 321, and a metal film 35 is formed at a lower surface of each of the connection terminals 321. In other words, the metal film 35 is formed at regions of the lower surface of the plate portion 31 that overlap the metal film 34 in a planar view.

A lower surface of the metal film 35 may be flush with a lower surface of the metal film 33. As each of the metal films 33, 34 and 35, for example, an Ag film, an Au film, a Ni/Au film (a metal film in which a Ni film and an Au film are stacked in this order), a Ni/Pd/Au film (a metal film in which a Ni film, a Pd film and an Au film are stacked in this order) or the like may be used.

Figure 3A:
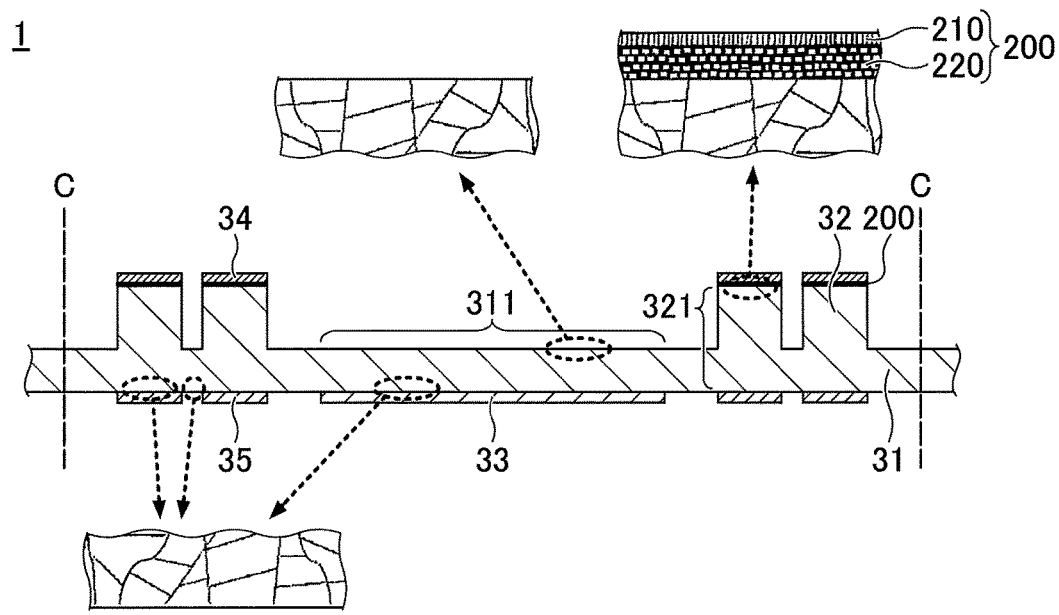
FIG. 3A and FIG. 3B are views for describing a work affected layer.
Figure 3B:
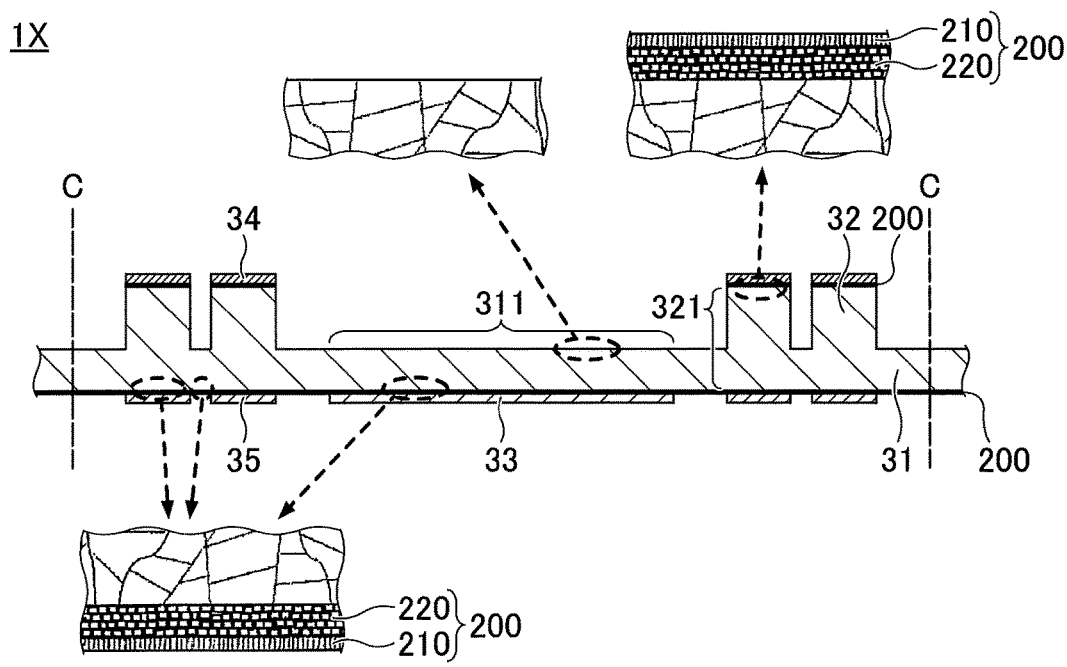

FIG. 3A and FIG. 3B are views for describing a work affected layer 200, wherein FIG. 3A is a view illustrating the lead frame 1 of the embodiment, and FIG. 3B is a view illustrating a lead frame 1X of a comparative example.

When various plastic workings such as molding, hot rolling, cold rolling, buffing, annealing and combinations thereof are applied on a plate material in manufacturing steps of a lead frame, the work affected layers 200 as illustrated in FIG. 3A and FIG. 3B are formed at both opposing surfaces of the plate material. The work affected layer 200 includes a Beilby layer 210 (upper layer) and an ultra-fine crystal layer 220 (lower layer). The Beilby layer 210 is constituted by an amorphous structure, and the ultra-fine crystal layer 220 is constituted by an ultra-fine crystalline aggregate structure. As described above, the work affected layer 200 is a layer in which metal crystal grains are finely formed compared with crystal grains inside the metal.

The lead frame 1 illustrated in FIG. 3A includes a work affected layer existing region at which the work affected layer 200 is formed at a surface, and a work affected layer non-existing region at which the work affected layer 200 is not formed at a surface, as a result of manufacturing steps (which will be described later) in which a part of the work affected layer 200 is removed. In the lead frame 1, the work affected layer 200 is formed at a front end surface (upper end surface) of each of the protruding portions 32, and the work affected layer 200 is not formed at a region of the upper surface of the plate portion 31 at which the protruding portions 32 are not formed. In other words, the front end surface of each of the protruding portions 32 is a work affected layer existing region, and the region of the upper surface of the plate portion 31 at which the protruding portions 32 are not formed is a work affected layer non-existing region. Further, in the lead frame 1, the entirety of the lower surface of the plate portion 31 is a work affected layer non-existing region at which the work affected layer 200 is not formed at a surface.

Meanwhile, the lead frame 1X of the comparative example illustrated in FIG. 3B includes a work affected layer existing region and a work affected layer non-existing region as well. In the lead frame 1X, similarly as the lead frame 1, the work affected layer 200 is formed at a front end surface (upper end surface) of each of the protruding portions 32, and the work affected layer 200 is not formed at a region of the upper surface of the plate portion 31 at which the protruding portions 32 are not formed. In other words, the front end surface of each of the protruding portions 32 is a work affected layer existing region, and the region of the upper surface of the plate portion 31 at which the protruding portions 32 are not formed is a work affected layer non-existing region. Further, in the lead frame 1X, different from the lead frame 1, the entirety of the lower surface of the plate portion 31 is a work affected layer existing region at which the work affected layer 200 is formed at a surface.

As such, in the lead frame 1X, surface areas of the work affected layer existing regions at the upper surface and the lower surface of the plate portion 31 are largely different. Thus, residual stresses of the work affected layers 200 exist at the upper surface and the lower surface of the plate portion 31 are not balanced, and a warp occurs. On the other hand, in the lead frame 1, surface areas of the work affected layer existing regions at the upper surface and the lower surface of the plate portion 31 are approximated. Alternatively, surface areas of the work affected layer non-existing regions at the upper surface and the lower surface of the plate portion 31 are approximated. Thus, residual stresses of the work affected layers 200 at the upper surface and the lower surface of the plate portion 31 are balanced, and warpage of the lead frame 1 can be reduced compared with that of the lead frame 1X.

(Method of Manufacturing Lead Frame)

Next, a method of manufacturing the lead frame 1 of the first embodiment is described by illustrating the unit lead frame 30. FIG. 4A to FIG. 6D are views illustrating an example of manufacturing steps of the lead frame 1 of the first embodiment, and are cross-sectional views corresponding to FIG. 2B.

Figure 4A:
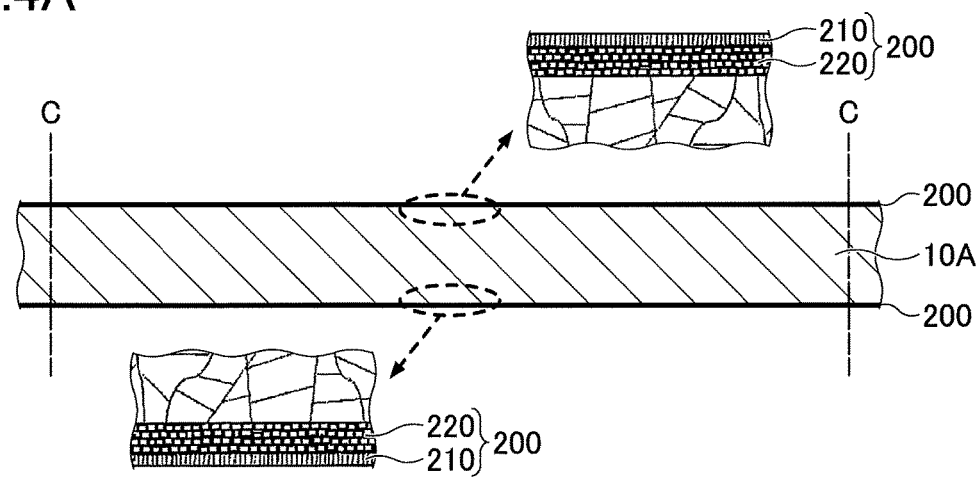
FIG. 4A to FIG. 4D are views illustrating an example of manufacturing steps of the lead frame of the first embodiment.

First, in a step illustrated in FIG. 4A, a plate material 10A (metal plate) having a same shape as the substrate frame 10 illustrated in FIG. 1, and made of a metal is prepared. As a material of the plate material 10A, for example, copper (Cu), Cu-based alloy, iron-nickel (Fe—Ni), Fe—Ni-based alloy, stainless steel or the like may be used. The thickness of the plate material 10A may be, for example, approximately 100 to 200 μm. The work affected layer 200 is formed at the entirety of each of an upper surface and a lower surface of the plate material 10A. The thickness of the work affected layer 200 may be, for example, approximately a few μm.

Figure 4B:
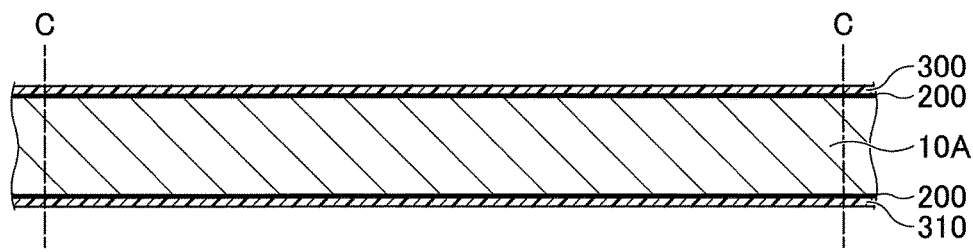
Figure 4C:
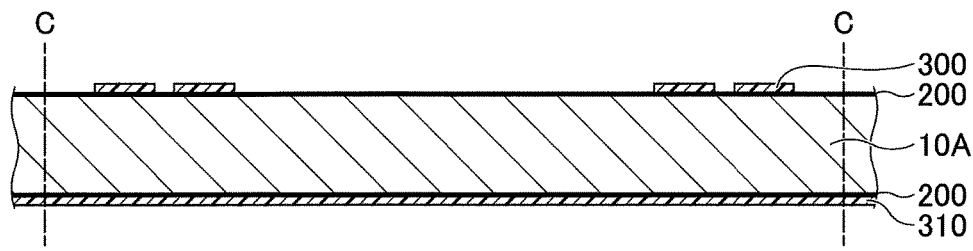

Next, in a step illustrated in FIG. 4B, a photosensitive resist 300 is formed on the entirety of the upper surface of the plate material 10A, and a photosensitive resist 310 is formed on the entirety of the lower surface of the plate material 10A. As each of the resists 300 and 310, for example, a dry film resist, an electrodeposition resist or the like may be used. Then, the resist 300 is patterned as illustrated in FIG. 4C by exposing and developing the resist 300. The resist 300 is patterned to cover portions of the plate material 10A at which the protruding portions 32 are to be formed, respectively. The resist 310 is left to cover the entirety of the lower surface of the plate material 10A.

Figure 4D:
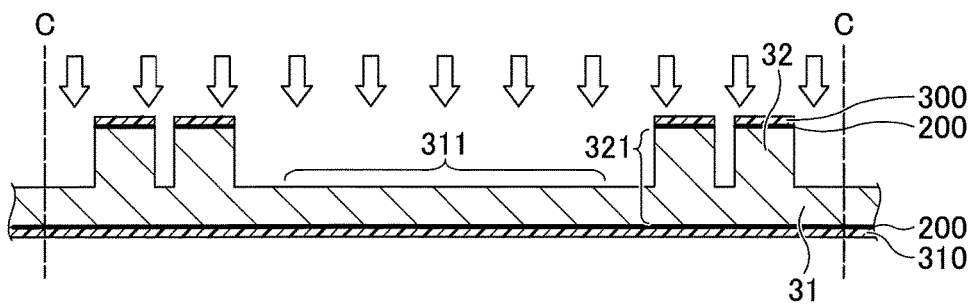

Next, in a step illustrated in FIG. 4D, the plate material 10A is half-etched by using the resists 300 and 310 as etching masks. Regions of the plate material 10A that are not covered by the resist 300 are half-etched from an upper surface side of the plate material 10A, and the plate portion 31 and the protruding portions 32 are formed. When the plate material 10A is made of copper, for example, the plate portion 31 including the chip mounting portion 311, and the protruding portions 32 are formed by wet etching using cupric chloride aqueous solution. The protruding portions 32 and portions of the plate portion 31 overlapping the protruding portions 32 in a planar view constitute the connection terminals 321, respectively. Each of the half-etched regions becomes the work affected layer non-existing region at which the work affected layer 200 is removed. In other words, each of the regions of the upper surface of the plate portion 31 at which the protruding portion 32 is not formed becomes the work affected layer non-existing region.

Figure 5A:
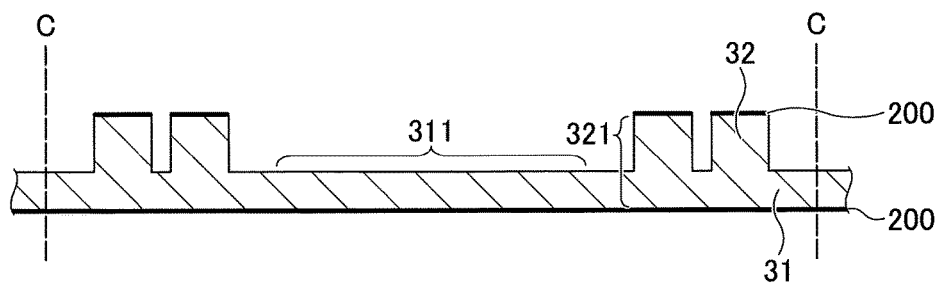
FIG. 5A to FIG. 5D are views illustrating an example of the manufacturing steps of the lead frame of the first embodiment.

Next, in a step illustrated in FIG. 5A, the resists 300 and 310 illustrated in FIG. 4D are removed. Next, in a step illustrated in FIG. 5B, a resist 320 that covers the upper surface side of the plate portion 31 is formed. As the resist 320, for example, a dry film resist, an electrodeposition resist or the like may be used. Next, in a step illustrated in FIG. 5C, the lower surface of the plate portion 31 is soft-etched, and the work affected layer 200 formed at the lower surface of the plate portion 31 is removed. For example, the plate portion 31 is etched for approximately 1 to 2 μm from the lower surface of the plate portion 31. Here, the soft-etching is an electrochemical method of uniformly etching the lower surface of the plate portion 31 by approximately a few μm so that the work affected layer 200 can be removed. The soft-etching may be performed by, for example, wet etching using cupric chloride aqueous solution. Next, in a step illustrated in FIG. 5D, the resist 320 illustrated in FIG. 5C is removed.

Here, for example, another method of removing the work affected layers 200 formed at the upper surface and the lower surface of the plate material 10A, respectively, by soft-etching the upper surface and the lower surface of the plate material 10A in a step prior to the step of FIG. 4A may be considered. However, the work affected layer 200 has a function to protect a surface quality of the plate material 10A. Thus, from a viewpoint of surface quality protection of the plate material 10A, it is undesirable to remove the work affected layers 200 too early, and it is preferable to remove the work affected layers 200 in the manufacturing steps of the lead frame 1.

Figure 6A:
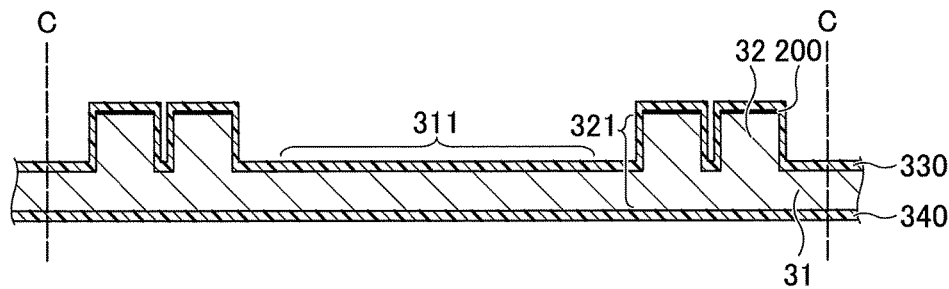
FIG. 6A to FIG. 6D are views illustrating an example of the manufacturing steps of the lead frame of the first embodiment.

Next, in a step illustrated in FIG. 6A, a photosensitive resist 330 is formed at the upper surface of the plate portion 31 and the upper surface and a side surface of each of the protruding portions 32. A photosensitive resist 340 is formed at the lower surface of the plate portion 31. As each of the resists 330 and 340, for example, a dry film resist, an electrodeposition resist or the like may be used. Then, in a step illustrated in FIG. 6B, by exposing and developing the resists 330 and 340, open portions 330x, 340x and 340y are formed. The open portions 330x are formed to expose the upper surface of each of the protruding portions 32 (upper surface of each of the connection terminals 321). The open portions 340x are formed to expose a lower surface of each of the connection terminals 321. The open portion 340y is formed to expose a lower surface of the chip mounting portion 311.

Figure 6B:
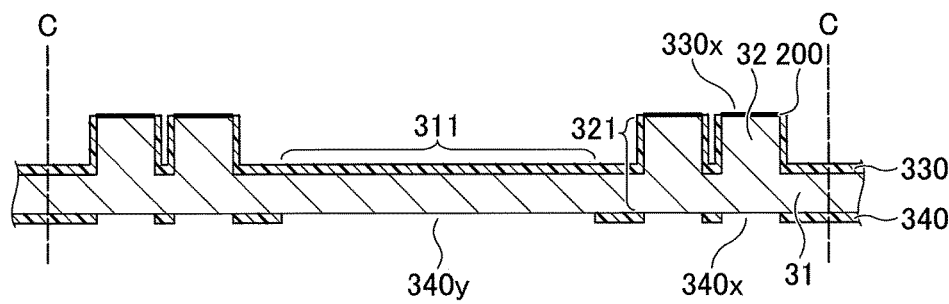
Figure 6C:
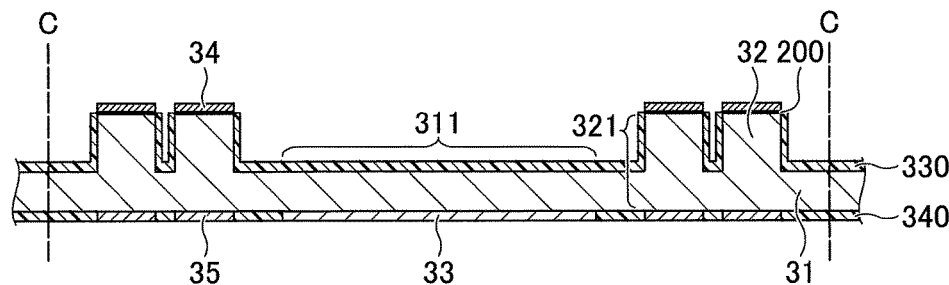

Next, in a step illustrated in FIG. 6C, a metal film 34 is formed at the upper surface of each of the protruding portions 32 (upper surface of each of the connection terminals 321) exposed in the corresponding open portion 330x, and a metal film 35 is formed at the lower surface of each of the connection terminals 321 exposed in the corresponding open portion 340x. The metal film 35 is formed at regions of the lower surface of the plate portion 31 that overlap the metal film 34 in a planar view. Further, a metal film 33 is formed at the lower surface of the chip mounting portion 311 exposed in the open portion 340y.

The material of each of the metal films 33, 34 and 35 is as described above. The metal films 33, 34 and 35 may be formed by electrolytic plating using the plate portion 31 as a power supply path, for example. Here, as the lower surface of the plate portion 31 is the work affected layer non-existing region at which the work affected layer 200 does not exist, an electrolytic plating film may be appropriately formed.

Figure 6D:
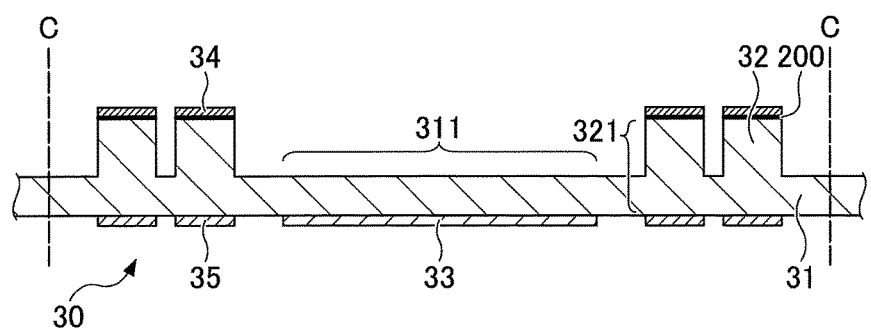

Next, in a step illustrated in FIG. 6D, the resists 330 and 340 illustrated in FIG. 6C are removed. With this, the lead frame 1 (see FIG. 1) in which the unit lead frames 30 are aligned in a matrix form is completed.

Figure 7A:
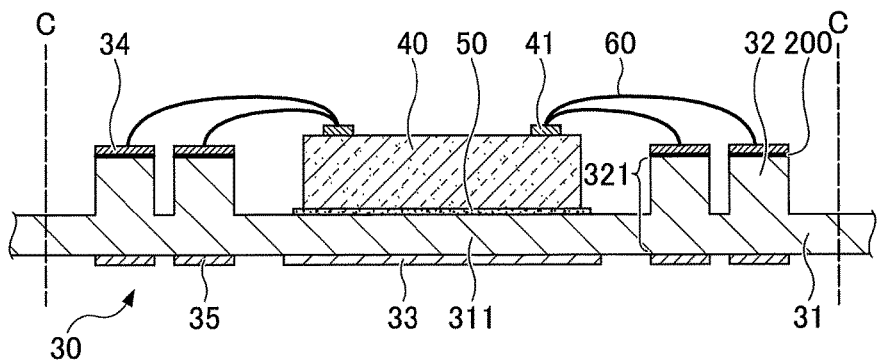
FIG. 7A to FIG. 7D are views illustrating an example of manufacturing steps of a semiconductor device of the first embodiment.

Subsequently, steps of manufacturing a semiconductor device by mounting a semiconductor chip 40 on each of the unit lead frames 30 are described. First, in a step illustrated in FIG. 7A, the semiconductor chip 40 is mounted on the upper surface of the chip mounting portion 311 of each of the unit lead frames 30 in a face-up manner. The semiconductor chip 40 may be mounted on the upper surface of the chip mounting portion 311 via an adhesive agent 50 such as a die attach film (die-bonding), for example. At this time, the die attach film is cured by being heated to predetermined temperature. As the adhesive agent 50, instead of a film type adhesive agent such as the die attach film, a paste type adhesive agent may be used. Then, electrode terminals 41 formed at a circuit forming surface of the semiconductor chip 40 are electrically connected with the metal film 34 via metal wires 60 that are gold wires, copper wires or the like, respectively. The metal wires 60 may be connected to the electrode terminals 41 of the semiconductor chip 40 and the metal film 34 by a wire bonding method, for example.

Here, the hardness of the work affected layer existing region at which the work affected layer 200 exists is higher than the hardness of the work affected layer non-existing region at which the work affected layer 200 does not exist. Thus, when wire bonding, if the work affected layer 200 exists under the metal film 34 to which the wire is bonded, hardness of the front end surface of the protruding portion 32 becomes high. As the work affected layer 200 exits at the front end surface of each of the protruding portions 32 of the first embodiment, wire bonding of the metal wire 60 to the metal film 34 under which the work affected layer 200 exists is advantageously facilitated.

Figure 7B:
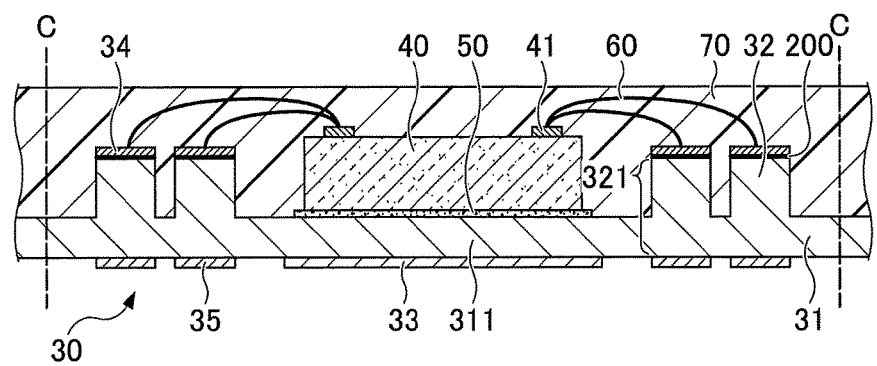

Next, in a step illustrated in FIG. 7B, a resin portion (encapsulation resin) 70 that seals the unit lead frames 30, the semiconductor chips 40 and the metal wires 60 is formed. As the resin portion 70, for example, so-called mold resin or the like in which fillers are included in epoxy resin may be used. The resin portion 70 may be formed by transfer molding, compression molding or the like, for example.

Figure 7C:
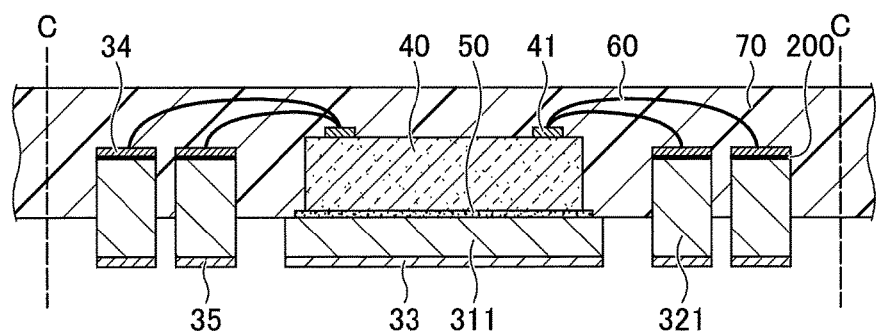

Next, in a step illustrated in FIG. 7C, each of the unit lead frames 30 is etched from the lower surface side (by wet etching, for example). At this time, by selecting etching solution that can selectively remove the plate portion 31 (Cu or the like) with respect to the metal films 33 and 35 (Ni/Pd/Au plating films or the like), the metal films 33 and 35 can function as etching masks. Thus, only regions of the plate portion 31 at which the metal films 33 and 35 are not formed are etched, and a plurality of the connection terminals 321 (leads) are independent from the chip mounting portion 311 (die pad), and the plurality of connection terminals 321 (leads) and the chip mounting portion 311 (die pad) protrude from a lower surface of the resin portion 70 (etch back step).

Figure 7D:
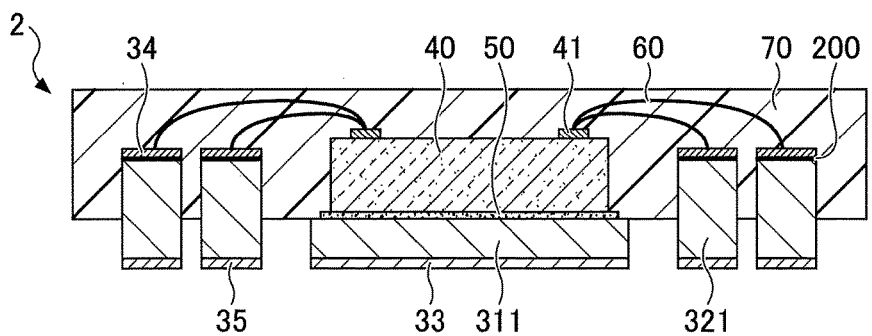

Next, in a step illustrated in FIG. 7D, by cutting the structure illustrated in FIG. 7C at cut positions C to be individualized, a plurality of semiconductor devices 2 are completed. The structure may be cut by a slicer or the like, for example.

Here, the semiconductor device 2 may be delivered as a single product, or the lead frame 1 before being individualized as illustrated in FIG. 1, FIG. 2A and FIG. 2B may be delivered as a single product. For the latter case, a user who obtains the lead frame 1 as a product may perform the steps illustrated in FIG. 7A to FIG. 7D to manufacture the plurality of semiconductor devices 2.

Modified Example 1 of First Embodiment

In a modified example 1 of the first embodiment, an example of a lead frame in which a metal film is formed at regions different from those of the first embodiment is described.

Figure 8A:
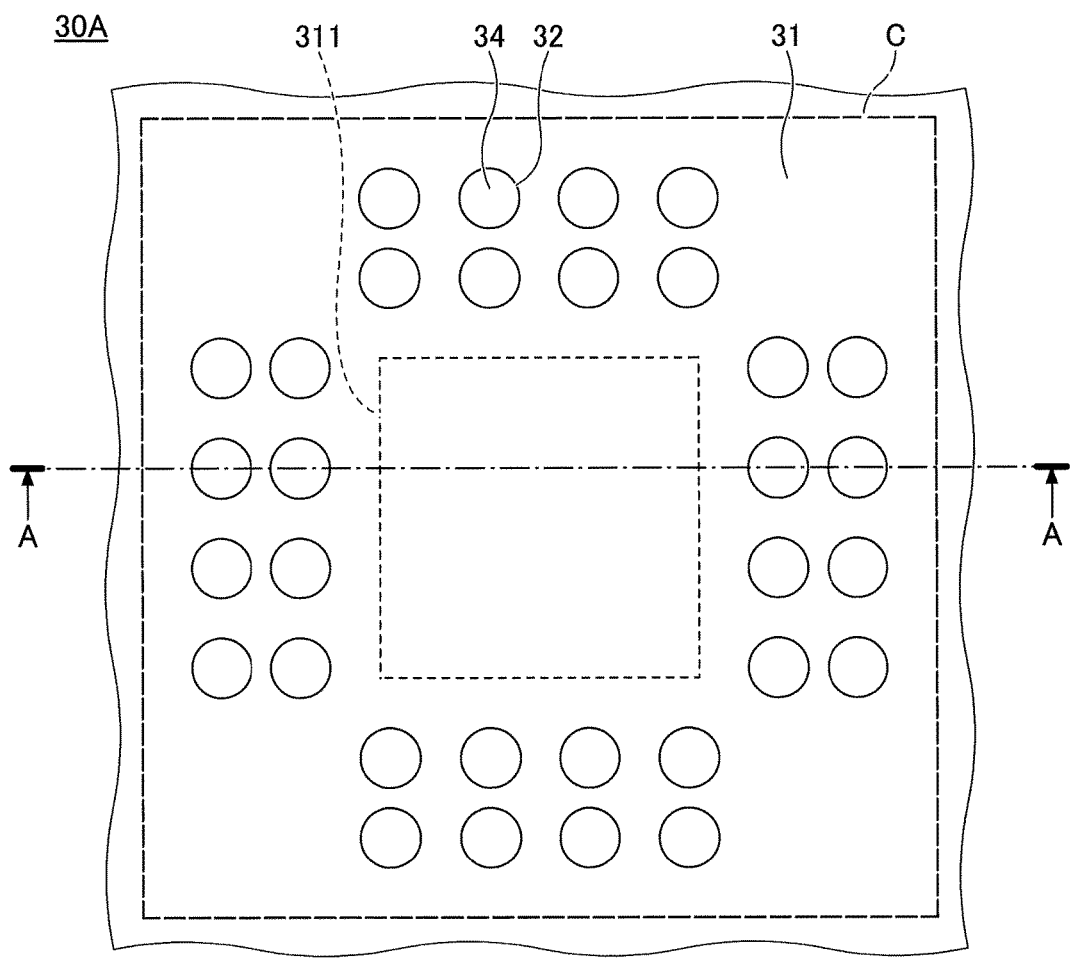
FIG. 8A and FIG. 8B are views illustrating an example of a unit lead frame constituting a lead frame of a modified example 1 of the first embodiment.
Figure 8B:
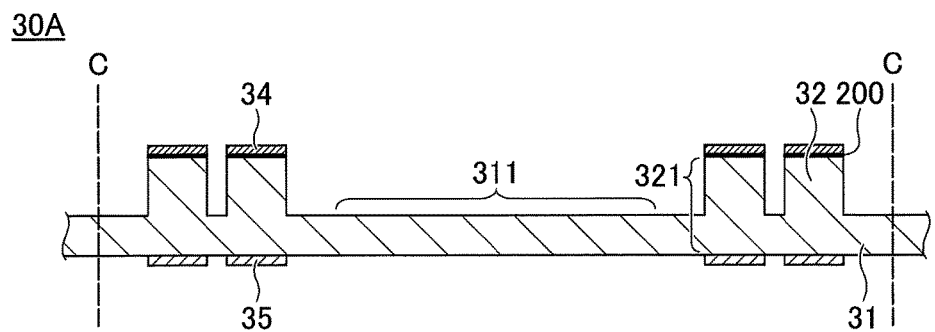

FIG. 8A and FIG. 8B are views illustrating an example of a structure of a unit lead frame 30A constituting a lead frame of the modified example 1 of the first embodiment. FIG. 8A is a plan view, and FIG. 8B is a cross-sectional view taken along an A-A line of FIG. 8A.

With reference to FIG. 8B, the unit lead frame 30A is different from the unit lead frame 30 (see FIG. 2B) in that the metal film 33 is not formed at the lower surface of the chip mounting portion 311.

Figure 9A:
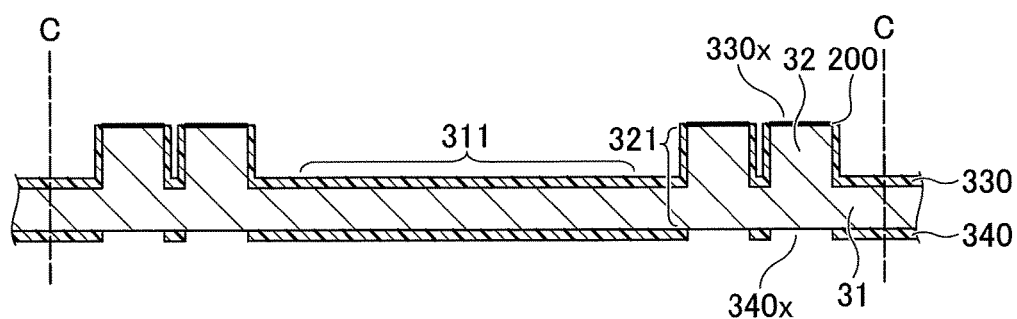
FIG. 9A to FIG. 9C are views illustrating an example of manufacturing steps of the lead frame of the modified example 1 of the first embodiment.
Figure 9B:
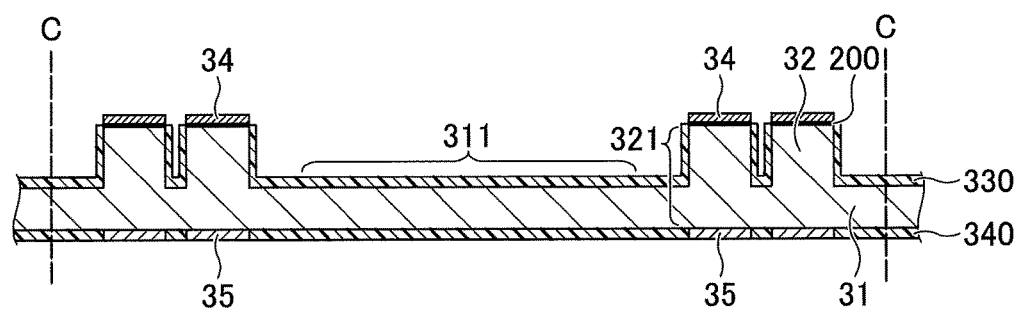
Figure 9C:
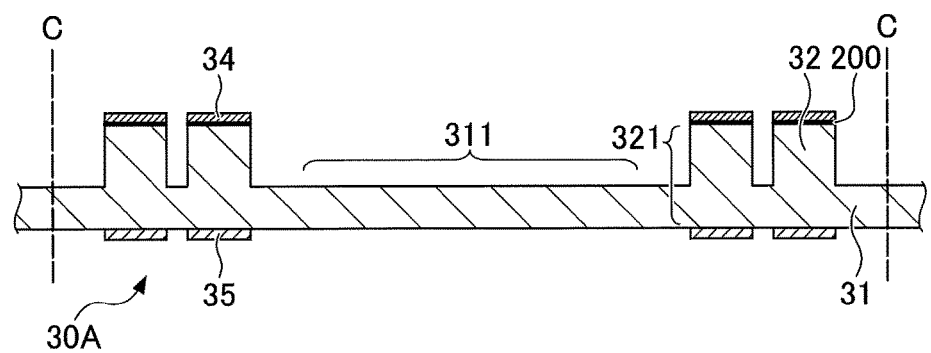

FIG. 9A to FIG. 9C are views illustrating an example of manufacturing steps of the lead frame 1 of the modified example 1 of the first embodiment, and are cross-sectional views corresponding to FIG. 8B. For forming the lead frame 1 in which the unit lead frames 30A are aligned in a matrix form, the steps same as those of the first embodiment described above with reference to FIG. 4A to FIG. 6A are performed.

Next, in a step illustrated in FIG. 9A, by exposing and developing the resists 330 and 340, the open portions 330x and 340x are formed (the open portion 340y illustrated in FIG. 6B is not formed). The open portions 330x are formed to expose the upper surface of each of the protruding portions 32 (upper surface of each of the connection terminals 321). The open portions 340x are formed to expose the lower surface of each of the connection terminals 321.

Next, in a step illustrated in FIG. 9B, the metal film 34 is formed at the upper surface of each of the protruding portions 32 (upper surface of each of the connection terminals 321) exposed in the corresponding open portion 330x, and the metal film 35 is formed at the lower surface of each of the connection terminals 321 exposed in the corresponding open portion 340x. The material of the metal films 34 and 35 and the method of forming the metal films 34 and 35 are the same as those of the first embodiment, for example.

Next, in a step illustrated in FIG. 9C, the resists 330 and 340 illustrated in FIG. 9B are removed. With this, the lead frame 1 (see FIG. 1) in which the unit lead frames 30A are aligned in a matrix form is completed.

Figure 10A:
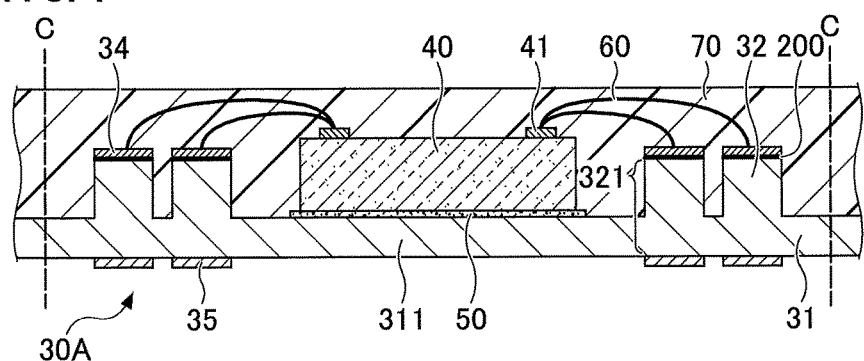
FIG. 10A to FIG. 10C are views illustrating an example of manufacturing step of a semiconductor device of the modified example 1 of the first embodiment.

Subsequently, steps of manufacturing a semiconductor device by mounting the semiconductor chip 40 on each of the unit lead frames 30A are described. First, after performing the step same as that of FIG. 7A of the first embodiment, in a step illustrated in FIG. 10A, the resin portion 70 that seals the unit lead frames 30A, the semiconductor chips 40 and the metal wires 60 is formed. As the resin portion 70, for example, so-called mold resin or the like in which fillers are included in epoxy resin may be used. The resin portion 70 may be formed by transfer molding, compression molding or the like, for example.

Figure 10B:
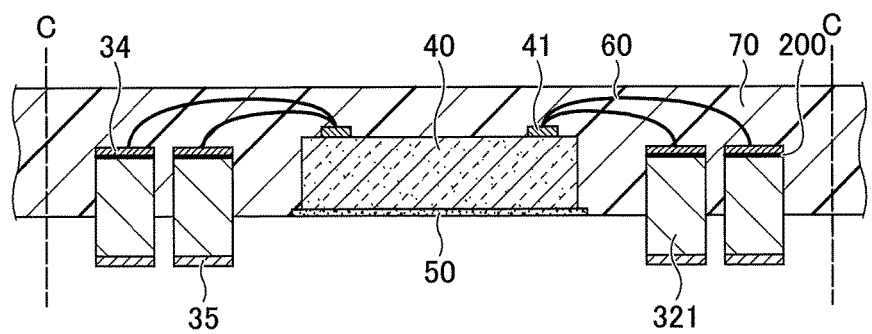

Next, in a step illustrated in FIG. 10B, each of the unit lead frames 30A is etched from the lower surface side (by wet etching, for example). At this time, by selecting etching solution that can selectively remove the plate portion 31 (Cu or the like) with respect to the metal film 35 (Ni/Pd/Au plating films or the like), the metal film 35 can function as an etching mask. Thus, only regions of the plate portion 31 at which the metal film 35 is not formed are etched, and a plurality of connection terminals 321 (leads) are independently formed and the plurality of connection terminals 321 (leads) protrude from the lower surface of the resin portion 70 (etch back step). Here, as the metal film 33 is not formed at the lower surface of the chip mounting portion 311, the chip mounting portion 311 is also removed by the etching, and a lower surface of the adhesive agent 50 is exposed from the resin portion 70. The lower surface of the adhesive agent 50 and the lower surface of the resin portion 70 may be flush with each other, for example.

Figure 10C:
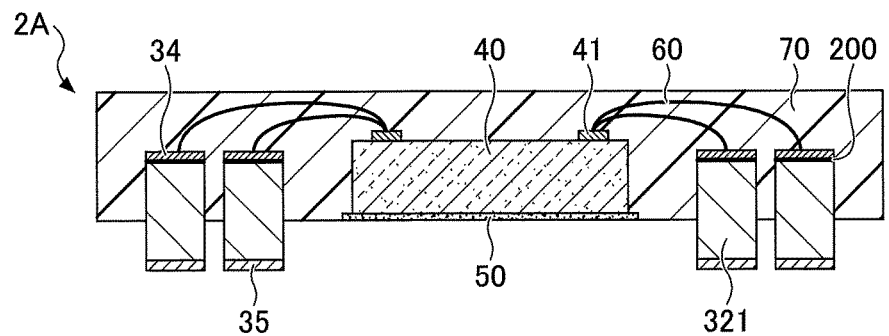

Next, in a step illustrated in FIG. 10C, by cutting the structure illustrated in FIG. 10B at cut positions C to be individualized, a plurality of semiconductor devices 2A are completed. The structure may be cut by a slicer or the like, for example.

Alternatively, a semiconductor device described in the following may be manufactured by mounting a semiconductor chip on each of the unit lead frames 30A.

Figure 11A:
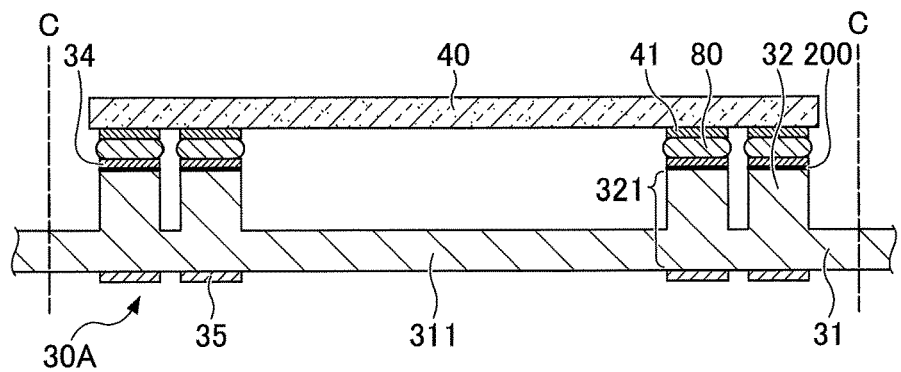
FIG. 11A to FIG. 11D are views illustrating an example of the manufacturing steps of the semiconductor device of the modified example 1 of the first embodiment.

First, in a step illustrated in FIG. 11A, the semiconductor chip 40 is mounted on each of the unit lead frames 30A in a face-down manner. Specifically, the electrode terminals 41 provided at the circuit forming surface of the semiconductor chip 40 are electrically connected to the metal film 34 formed at the upper surfaces of the connection terminals 321 via solder bumps 80, respectively.

Figure 11B:
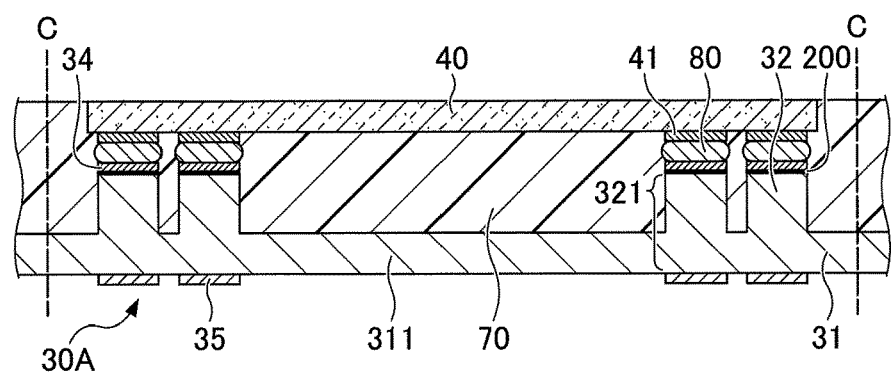

Next, in a step illustrated in FIG. 11B, the resin portion 70 that seals the unit lead frames 30A, the semiconductor chips 40 and the solder bumps 80 is formed. As the resin portion 70, for example, so-called mold resin or the like in which fillers are included in epoxy resin may be used. The resin portion 70 may be formed by transfer molding, compression molding or the like, for example. The resin portion 70 may be formed to expose the entirety of a back surface of the semiconductor chip 40, or may be formed to cover a part of or all of the back surface of the semiconductor chip 40.

Figure 11C:
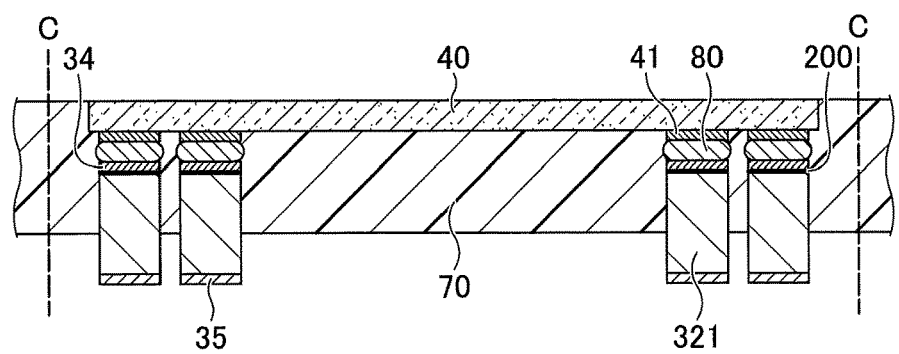

Next, in a step illustrated in FIG. 11C, each of the unit lead frames 30A is etched from the lower surface side (by wet etching, for example). At this time, by selecting etching solution that can selectively remove the plate portion 31 (Cu or the like) with respect to the metal film 35 (Ni/Pd/Au plating films or the like), the metal film 35 can function as an etching mask. Thus, only regions of the plate portion 31 at which the metal film 35 is not formed are etched, and a plurality of connection terminals 321 (leads) are independently formed, and the plurality of connection terminals 321 (leads) protrude from the lower surface of the resin portion 70 (etch back step). Here, as the metal film 33 is not formed at the lower surface of the chip mounting portion 311, the chip mounting portion 311 is also etched by the etching.

Figure 11D:
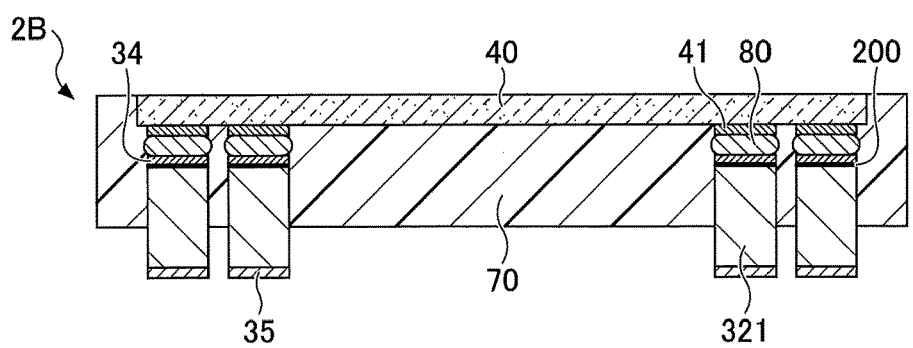

Next, in a step illustrated in FIG. 11D, by cutting the structure illustrated in FIG. 11C at cut positions C to be individualized, a plurality of semiconductor devices 2B are completed. The structure may be cut by a slicer or the like, for example.

As such, the semiconductor device 2B in which the semiconductor chip 40 is flip-chip mounted on the unit lead frame 30A can be actualized.

Modified Example 2 of First Embodiment

In a modified example 2 of the first embodiment, an example is described in which an order of the manufacturing steps of the modified example 1 of the first embodiment is changed.

FIG. 12A to FIG. 13D are views illustrating an example of manufacturing steps of the lead frame 1 of the modified example 2 of the first embodiment, and are cross-sectional views corresponding to FIG. 8B.

Figure 12A:
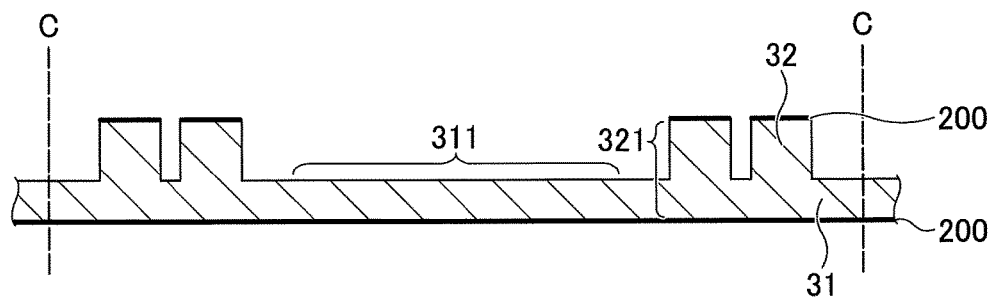
FIG. 12A to FIG. 12D are views illustrating an example of manufacturing steps of a lead frame of a modified example 2 of the first embodiment.
Figure 12B:
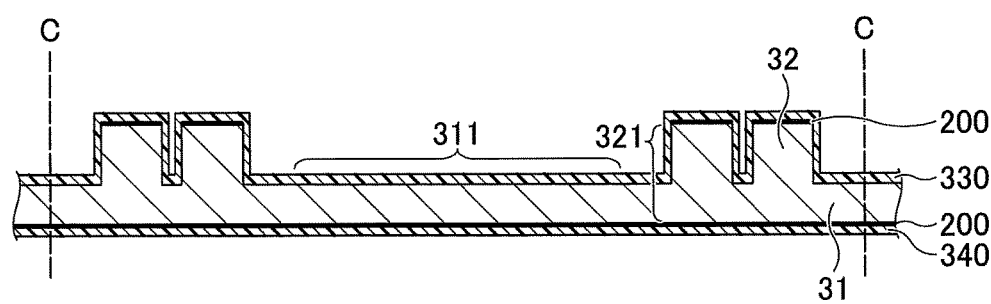

First, in a step illustrated in FIG. 12A, similar to the step illustrated in FIG. 5A, the resists 300 and 310 illustrated in FIG. 4D are removed. Next, in a step illustrated in FIG. 12B, similar to the step illustrated in FIG. 6A, the photosensitive resist 330 is formed at the upper surface of the plate portion 31 and the upper surface and the side surface of each of the protruding portions 32, and the photosensitive resist 340 is formed at the lower surface of the plate portion 31. As each of the resists 330 and 340, for example, a dry film resist, an electrodeposition resist or the like may be used.

Figure 12C:
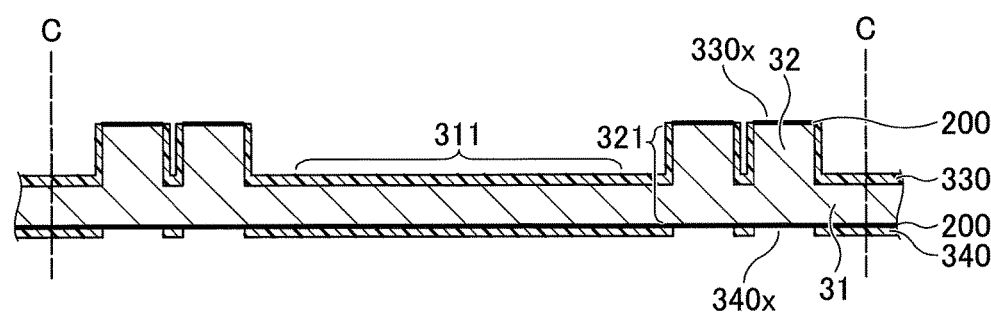

Next, in a step illustrated in FIG. 12C, similar to the step illustrated in FIG. 9A, by exposing and developing the resists 330 and 340, the open portions 330x and 340x are formed (the open portion 340y illustrated in FIG. 6B is not formed). The open portions 330x are formed to expose the upper surface of each of the protruding portions 32 (upper surface of each of the connection terminals 321). The open portions 340x are formed to expose the lower surface of each of the connection terminals 321.

Figure 12D:
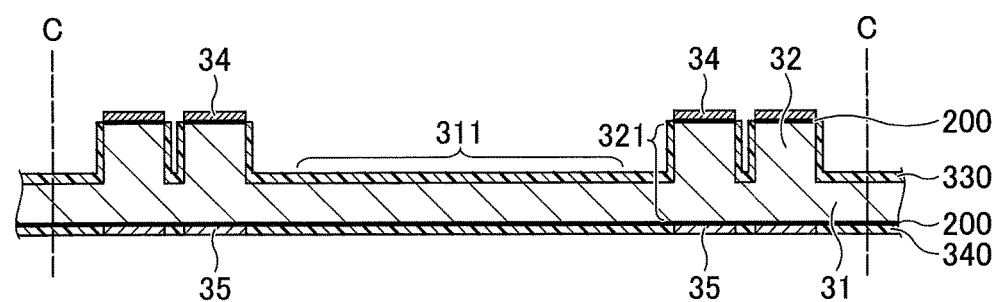

Next, in a step illustrated in FIG. 12D, similar to the step illustrated in FIG. 9B, the metal film 34 is formed at the upper surface of each of the protruding portions 32 (upper surface of each of the connection terminals 321) exposed in the corresponding open portion 330x, and the metal film 35 is formed at the lower surface of each of the connection terminals 321 exposed in the corresponding open portion

340x. The material of the metal films 34 and 35 and the method of forming the metal films 34 and 35 are the same as those of the first embodiment, for example. Next, in a step illustrated in FIG. 13A, similar to the step illustrated in FIG. 9C, the resists 330 and 340 illustrated in FIG. 12D are removed.

Figure 5B:
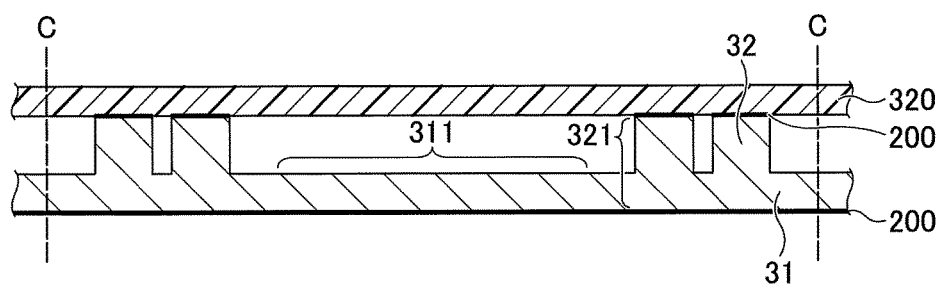
Figure 5C:
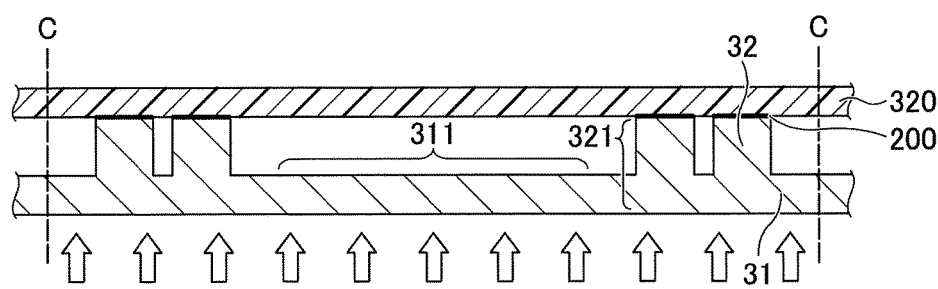
Figure 5D:
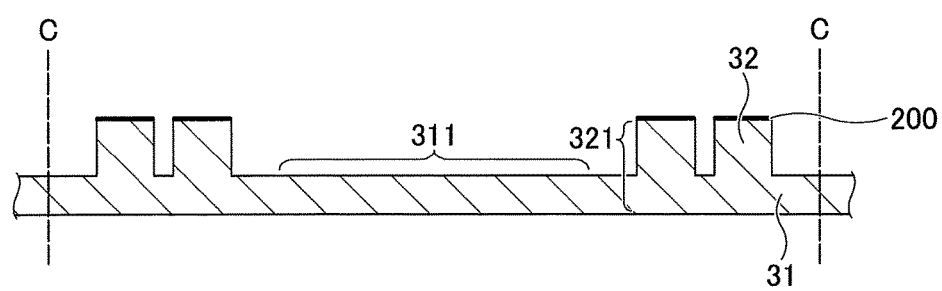
Figure 13A:
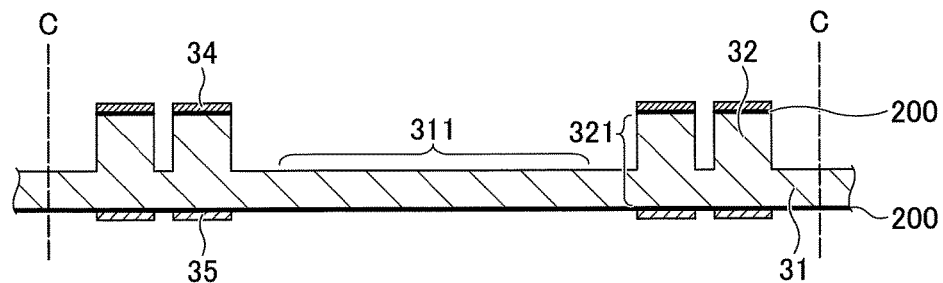
FIG. 13A to FIG. 13D are views illustrating an example of the manufacturing steps of the lead frame of the modified example 2 of the first embodiment.
Figure 13B:
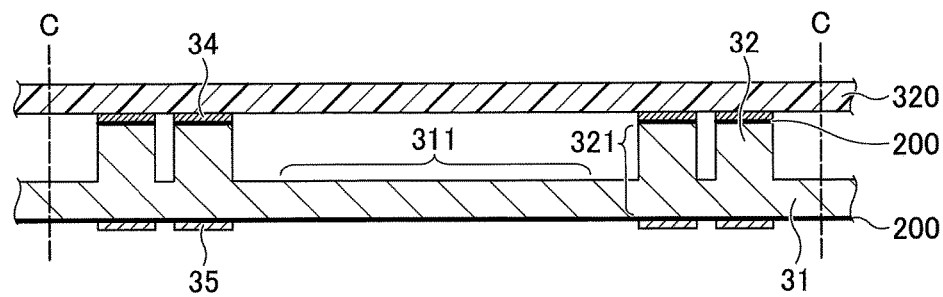
Figure 13C:
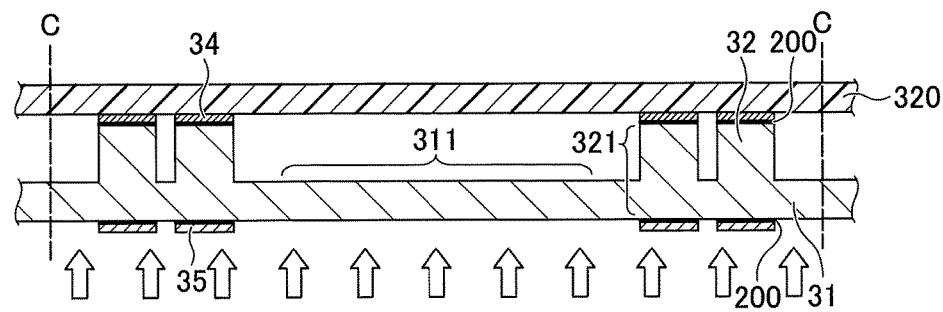
Figure 13D:
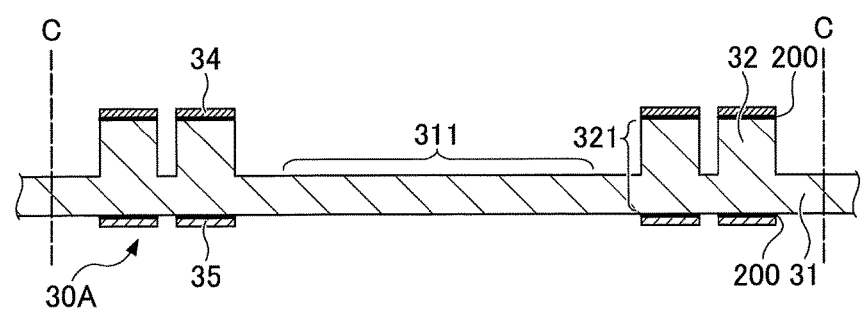

Next, in a step illustrated in FIG. 13B, similar to the step illustrated in FIG. 5B, the resist 320 that covers the upper surface side of the plate portion 31 is formed. As the resist 320, for example, a dry film resist, an electrodeposition resist or the like may be used. Next, in a step illustrated in FIG. 13C, similar to the step illustrated in FIG. 5C, the lower surface of the plate portion 31 is soft-etched, and the work affected layer 200 provided at regions of the lower surface of the plate portion 31 that are not covered by the metal film 35 is removed. Next, in a step illustrated in FIG. 13D, the resist 320 is removed. With this, the lead frame 1 (see FIG. 1) in which the unit lead frames 30A are aligned in a matrix form is completed.

As such, the step of removing the work affected layer 200 may be performed after the step of forming the metal films 34 and 35, and the work affected layer 200 at the regions of the lower surface of the plate portion 31 at which the metal film 35 is not formed may be removed. As such, by changing the order of the step of removing the work affected layer 200, options of the manufacturing steps can be increased. Even when this order is adopted, surface areas of the work affected layer existing regions at the upper surface and the lower surface of the plate portion 31 are approximated, residual stresses of the work affected layers 200 at the upper surface and the lower surface of the plate portion 31 are balanced, and warpage of the lead frame 1 can be reduced.

Second Embodiment

In a second embodiment, an example of a lead frame that is a different type from that of the first embodiment is described.

Figure 14A:
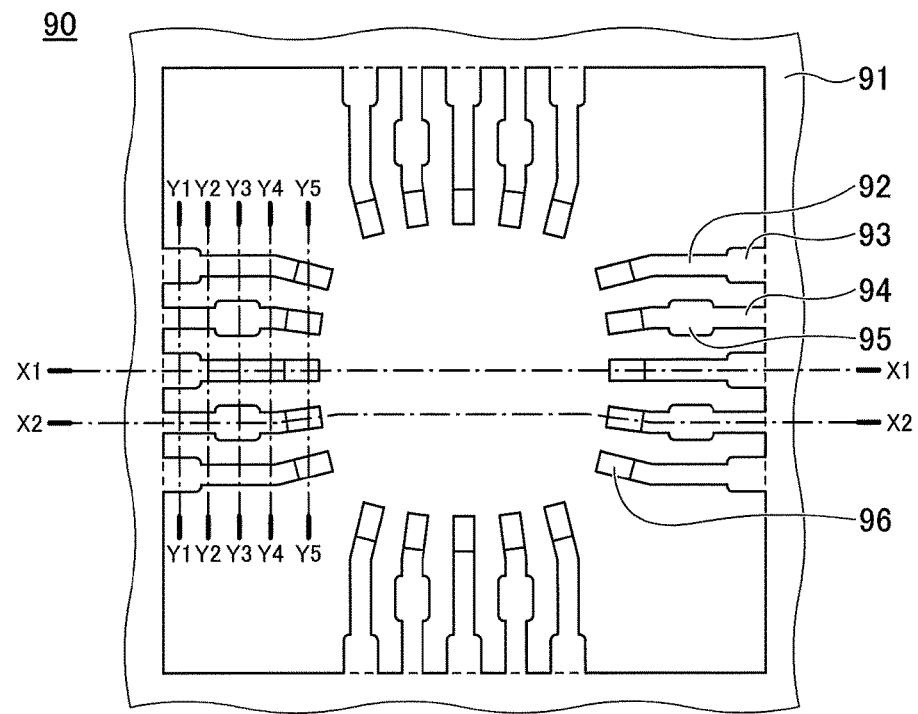
FIG. 14A and FIG. 14B are views illustrating an example of a structure of a unit lead frame constituting a lead frame of a second embodiment.
Figure 14B:
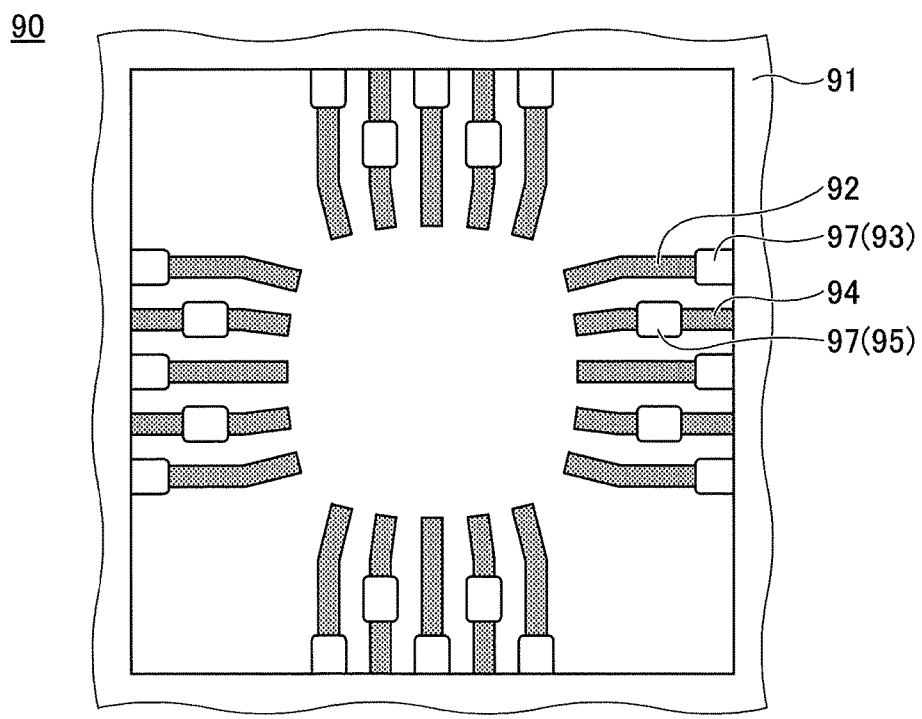
Figure 15A:
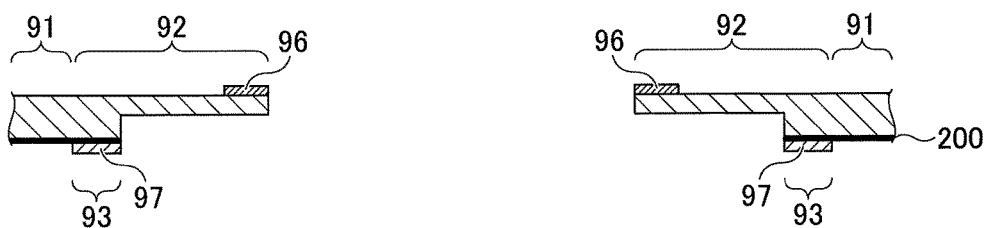
FIG. 15A and FIG. 15B are views illustrating an example of the structure of the unit lead frame constituting the lead frame of the second embodiment.
Figure 15B:
Figure 16A:
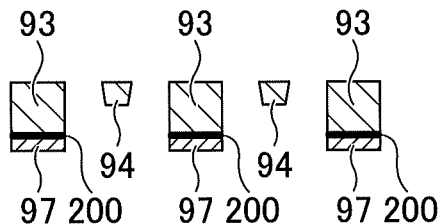
FIG. 16A to FIG. 16E are views illustrating an example of the structure of the unit lead frame constituting the lead frame of the second embodiment.
Figure 16B:
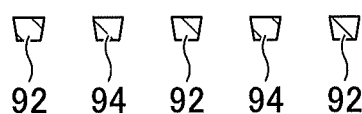
Figure 16C:
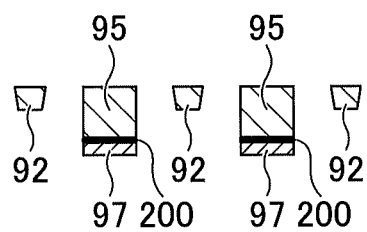
Figure 16D:
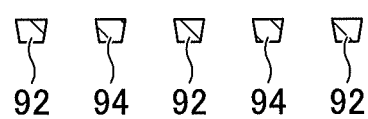
Figure 16E:
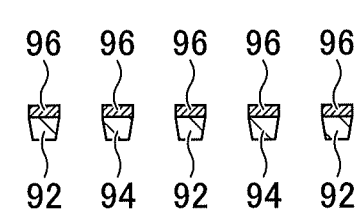

FIG. 14A to FIG. 16E are views illustrating an example of a unit lead frame 90 constituting the lead frame of the second embodiment. FIG. 14A is a plan view and FIG. 14B is a bottom view. FIG. 15A is a cross-sectional view taken along an X1-X1 line of FIG. 14A, and FIG. 15B is a cross-sectional view taken along an X2-X2 line of FIG. 14A. FIG. 16A is a cross-sectional view taken along a Y1-Y1 line of FIG. 14A, FIG. 16B is a cross-sectional view taken along a Y2-Y2 line of FIG. 14A, FIG. 16C is a cross-sectional view taken along a Y3-Y3 line of FIG. 14A, FIG. 16D is a cross-sectional view taken along a Y4-Y4 line of FIG. 14A, and FIG. 16E is a cross-sectional view taken along a Y5-Y5 line of FIG. 14A. The entire structure of the lead frame of the second embodiment is same as the lead frame 1 of FIG. 1. Thus, the lead frame of the second embodiment is also referred to as the lead frame 1 as well.

With reference to FIG. 14A to FIG. 16E, the unit lead frame 90 includes a frame portion 91, first leads 92, first connection terminals 93, second leads 94 and second connection terminals 95. The unit lead frame 90 is a so-called DR-QFN (Dual Raw Quad Flat Non-leaded Package), and is a package available for high density pins by providing the connection terminals in two columns. The first leads 92 and the second leads 94 are a typical example of the plate portion, and the first connection terminals 93 and the second connection terminals 95 are a typical example of the protruding portion.

The frame portion 91 is formed in a frame shape, for example, and the long and thin first leads 92 and the second leads 94 are alternately provided from predetermined regions at inside the frame portion 91 toward a center portion of the frame portion 91, in a planar view. During a manufacturing step of a semiconductor device, which will be described later, ends of the first leads 92 and the second leads 94 near the frame portion 91 are cut from the frame portion 91. Thus, each of the first leads 92 and the second leads 94 are electrically insulated from each other.

A predetermined region of a lower surface of each of the first leads 92 and the second leads 94 is half-etched (regions illustrated by dots in FIG. 14B). In other words, the first connection terminal 93 protrudes at a region of the lower surface of each of the first leads 92 that is not half-etched, and the second connection terminal 95 protrudes at a region of the lower surface of each of the second leads 94 that is not half-etched. The first connection terminals 93 and the second connection terminals 95 are provided along a perimeter of the frame portion 91 such that the first connection terminals 93 are positioned near the frame portion 91 and the second connection terminals 95 are positioned far from the frame portion 91 in a staggering pattern.

With reference to FIG. 15A and FIG. 15B as well, a metal film 96 is formed at a front end side of the upper surface of each of the first leads 92 and the second leads 94. The metal film 96 functions as a pad to which a bonding wire is connected, or to which an electrode terminal of a semiconductor device is flip-chip connected in manufacturing steps of the semiconductor device, which will be described later. Further, a metal film 97 is formed at the lower surface of each of the first connection terminals 93 and the second connection terminals 95. As a material of each of the metal films 96 and 97, for example, the material same as exemplified for the metal films 33 to 35 may be used.

The entirety of the upper surface of each of the first leads 92 and the second leads 94, and the half-etched region of the lower surface of each of the first leads 92 and the second leads 94 are the work affected layer non-existing regions at which the work affected layer 200 is not formed at a surface. Meanwhile, the lower surface of the frame portion 91, the lower surface of each of the first connection terminals 93 and the lower surface of each of the second connection terminals 95 are the work affected layer existing regions at which the work affected layer 200 is formed at a surface.

As such, in the unit lead frame 90, surface areas of the work affected layer existing regions at the upper surface and the lower surface of the frame portion 91, the first leads 92, the second leads 94, the first connection terminals 93 and the second connection terminals 95 are approximated, residual stresses of the work affected layers 200 are balanced, and warpage of unit lead frame 90 can be reduced.

(Method of Manufacturing Lead Frame)

Next, a method of manufacturing the lead frame 1 of the second embodiment is described by illustrating the unit lead frame 90. FIG. 17A to FIG. 22D are views illustrating an example of manufacturing steps of the lead frame 1 of the second embodiment.

FIG. 17A and FIG. 17B, FIG. 17C and FIG. 17D, FIG. 19A and FIG. 19B, FIG. 19C and FIG. 19D, FIG. 20A and FIG. 20B, FIG. 20C and FIG. 20D, FIG. 21A and FIG. 21B, FIG. 21C and FIG. 21D, FIG. 22A and FIG. 22B and FIG. 22C and FIG. 22D are cross-sectional views corresponding to FIG. 15A and FIG. 15B, respectively. FIG. 18A to FIG. 18E are cross-sectional views corresponding to FIG. 16A to FIG. 16E, respectively.

Figure 17A:
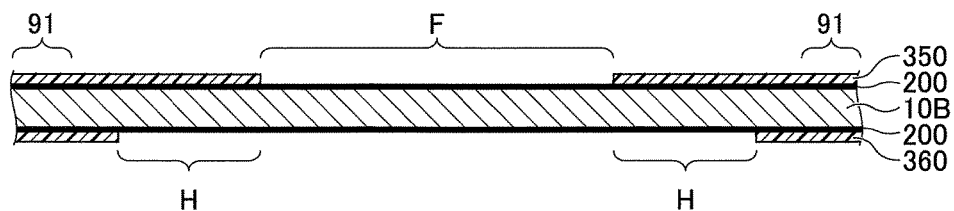
FIG. 17A to FIG. 17D are views illustrating an example of manufacturing steps of the lead frame of the second embodiment.
Figure 17B:
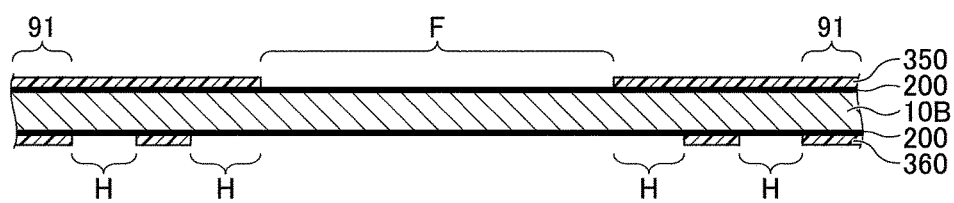
Figure 17C:
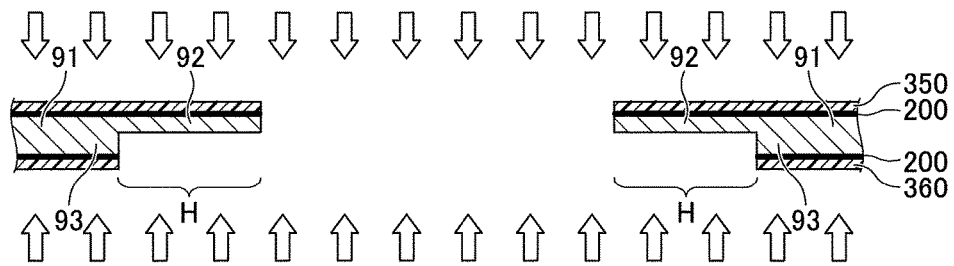
Figure 17D:
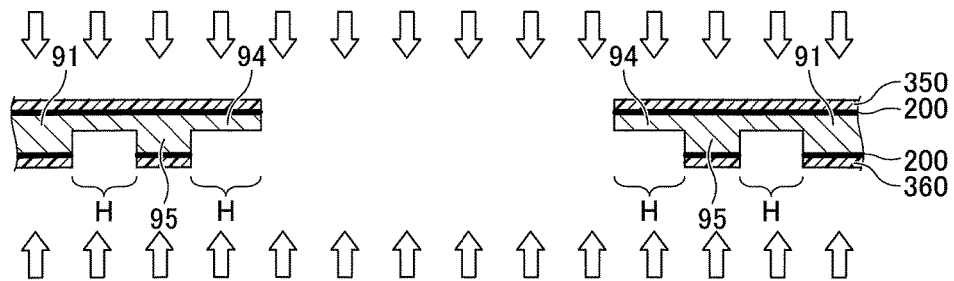
Figure 18A:
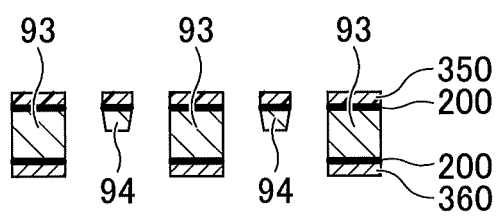
FIG. 18A to FIG. 18E are views illustrating an example of the manufacturing steps of the lead frame of the second embodiment.
Figure 18B:
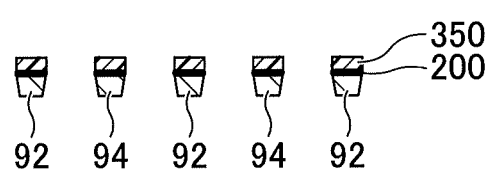
Figure 18C:
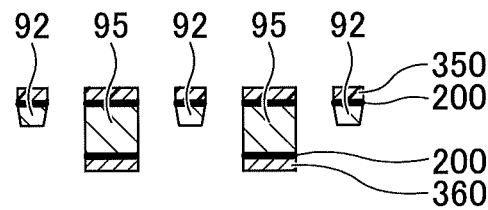
Figure 18D:
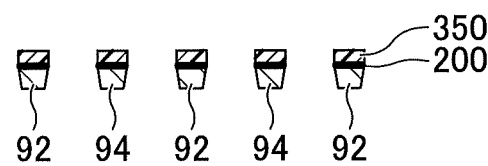
Figure 18E:
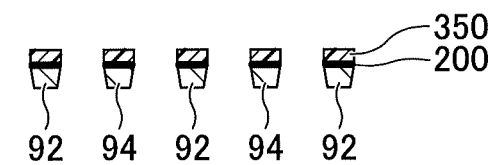

First, in a step illustrated in FIG. 17A and FIG. 17B, a plate material 10B having predetermined shape and made of a metal is prepared. As a material of the plate material 10B, for example, copper (Cu), Cu-based alloy, iron-nickel (Fe—Ni), Fe—Ni-based alloy, stainless steel or the like may be used. The thickness of the plate material 10B may be, for example, approximately 100 to 200 µm. The work affected layer 200 is formed at the entirety of each of an upper surface and a lower surface of the plate material 10B. The thickness of the work affected layer 200 may be, for example, approximately a few µm.

Then, a photosensitive resist 350 is formed on the entirety of the upper surface of the plate material 10B, and a photosensitive resist 360 is formed on the entirety of the lower surface of the plate material 10B. Then, the resists 350 and 360 are patterned as illustrated in FIG. 17A and FIG. 17B by exposing and developing the resists 350 and 360. As each of the resists 350 and 360, for example, a dry film resist, an electrodeposition resist or the like may be used. "H" illustrates regions to be half-etched. "F" illustrates a region to be half-etched from both of an upper surface side and a lower surface side so that the entirety of the region "F" of the plate material 10B is removed.

Next, in a step illustrated in FIG. 17C and FIG. 17D and FIG. 18A to FIG. 18E, the plate material 10B is half-etched from both surfaces by using the resists 350 and 360 as etching masks. A region of the plate material 10B at which both of the resists 350 and 360 are not formed (regions indicated by "F" in FIG. 17A and FIG. 17B) is half-etched from the both surfaces, and the entirety of the plate material 10B is removed. Further, regions covered by the resist 350 but not covered by the resist 360 (regions indicated by "H") are half-etched from the lower surface side of the plate material 10B, and the frame portion 91, the first leads 92, the first connection terminals 93, the second leads 94 and the second connection terminals 95 are formed.

Next, in a step illustrated in FIG. 19A and FIG. 19B, the resists 350 and 360 illustrated in FIG. 17C, FIG. 17D and FIG. 18A to FIG. 18E are removed. Next, in a step illustrated in FIG. 19C and FIG. 19D, a resist 370 that covers a lower surface side of each of the frame portion 91, the first leads 92, the first connection terminals 93, the second leads 94 and the second connection terminals 95 is formed. As the resist 370, for example, a dry film resist, an electrodeposition resist or the like may be used.

Figure 20A:
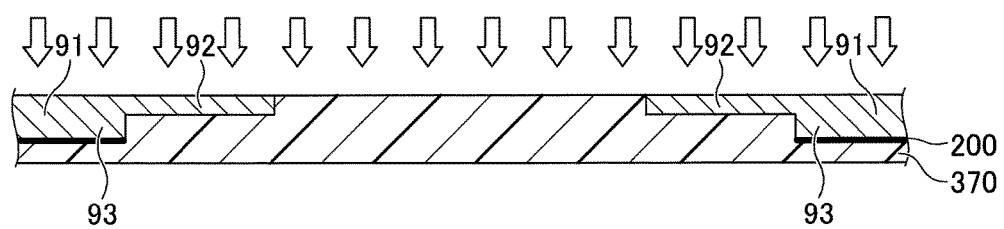
FIG. 20A to FIG. 20D are views illustrating an example of the manufacturing steps of the lead frame of the second embodiment.
Figure 20B:
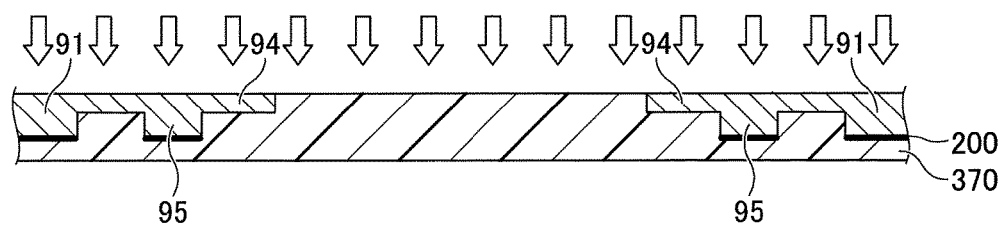
Figure 20C:
Figure 20D:

Next, in a step illustrated in FIG. 20A and FIG. 20B, an upper surface of each of the frame portion 91, the first leads 92, the first connection terminals 93, the second leads 94 and the second connection terminals 95 is soft-etched, and the work affected layer 200 exists at the upper surface of each of the frame portion 91, the first leads 92, the first connection terminals 93, the second leads 94 and the second connection terminals 95 is removed. The soft-etching may be performed by, for example, wet etching using cupric chloride aqueous solution. Next, in a step illustrated in FIG. 20C and FIG. 20D, the resist 370 illustrated in FIG. 20A and FIG. 20B is removed.

Figure 21A:
FIG. 21A to FIG. 21D are views illustrating an example of the manufacturing steps of the lead frame of the second embodiment.
Figure 21B:
Figure 21C:
Figure 21D:
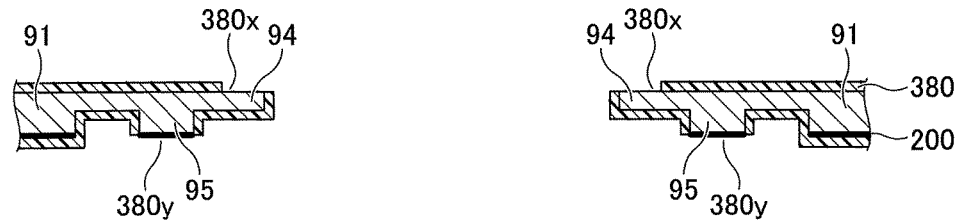

Next, in a step illustrated in FIG. 21A and FIG. 21B, a photosensitive resist 380 is formed at surfaces (upper surface, side surface and lower surface) of each of the frame portion 91, the first leads 92, the first connection terminals 93, the second leads 94 and the second connection terminals 95. As the resist 380, for example, a dry film resist, an electrodeposition resist or the like may be used. Then, in a step illustrated in FIG. 21C and FIG. 21D, by exposing and developing the resist 380, open portions 380x and 380y are formed. The open portions 380x are formed to expose regions of the upper surfaces of the first leads 92 and the second leads 94 at which the metal film 96 is to be formed. The open portions 380y are formed to expose regions of the lower surfaces of the first connection terminals 93 and the second connection terminals 95 at which the metal film 97 is to be formed.

Figure 22A:
FIG. 22A to FIG. 22D are views illustrating an example of the manufacturing steps of the lead frame of the second embodiment.
Figure 22B:

Next, in a step illustrated in FIG. 22A and FIG. 22B, the metal film 96 is formed on the upper surfaces of the first leads 92 and the second leads 94 exposed in the open portions 380x, respectively, and the metal film 97 is formed on the lower surfaces of the first connection terminals 93 and the second connection terminals 95 exposed in the open portions 380y, respectively. As each of the metal films 96 and 97, for example, the metal film exemplified for the metal films 33 to 35 may be used. The metal films 96 and 97 may be formed by electrolytic plating using each of the frame portion 91, the first leads 92, the first connection terminals 93, the second leads 94 and the second connection terminals 95 as a power supply path, for example.

Figure 22C:
Figure 22D:

Next, in a step illustrated in FIG. 22C and FIG. 22D, the resist 380 illustrated in FIG. 22A and FIG. 22B is removed. With this, the lead frame 1 in which the unit lead frames 90 are aligned in a matrix form is completed.

Figure 23A:
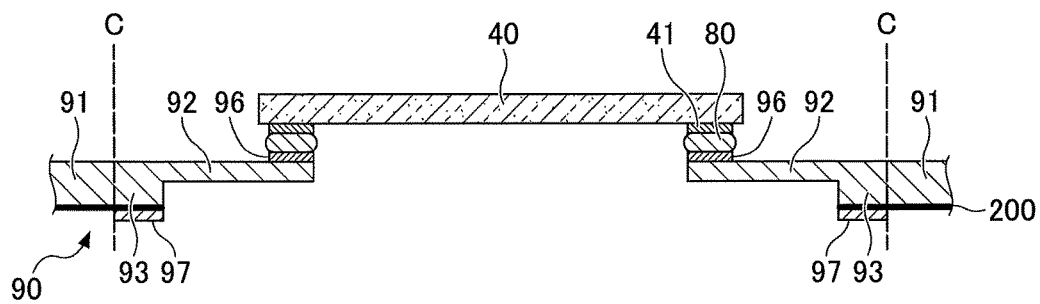
FIG. 23A to FIG. 23D are views illustrating an example of manufacturing steps of a semiconductor device of the second embodiment.
Figure 23B:
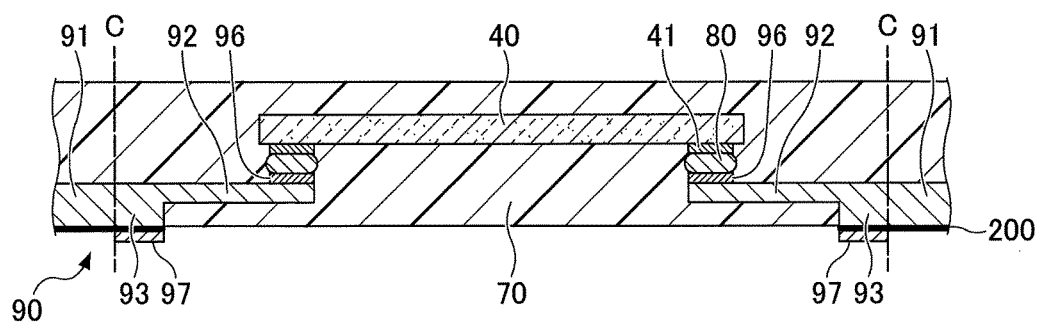
Figure 23C:
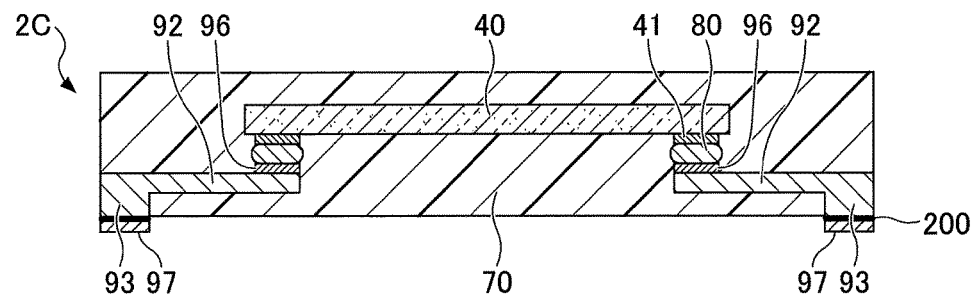

Subsequently, steps of manufacturing the semiconductor device by mounting the semiconductor chip 40 on each of the unit lead frames 90 are described. FIG. 23A to FIG. 23C are cross-sectional views corresponding to FIG. 15A, and FIG. 23D is a cross-sectional view corresponding to FIG. 15B.

First, in a step illustrated in FIG. 23A, the semiconductor chip 40 is mounted on each of the unit lead frames 90 in a face-down manner. Specifically, the electrode terminals 41 formed at the circuit forming surface of the semiconductor chip 40 are electrically connected to the metal film 96 formed at the upper surfaces of the first leads 92 and the second leads 94 via solder bumps 80, respectively.

Next, in a step illustrated in FIG. 23B, the resin portion 70 that seals the unit lead frames 90, the semiconductor chips 40 and the solder bumps 80 is formed. As the resin portion 70, for example, so-called mold resin or the like in which fillers are included in epoxy resin may be used. The resin portion 70 may be formed by transfer molding, compression molding or the like, for example. The resin portion 70 may be formed to expose the entirety of the back surface of the semiconductor chip 40, or may be formed to cover a part of or all of the back surface of the semiconductor chip 40.

Figure 23D:
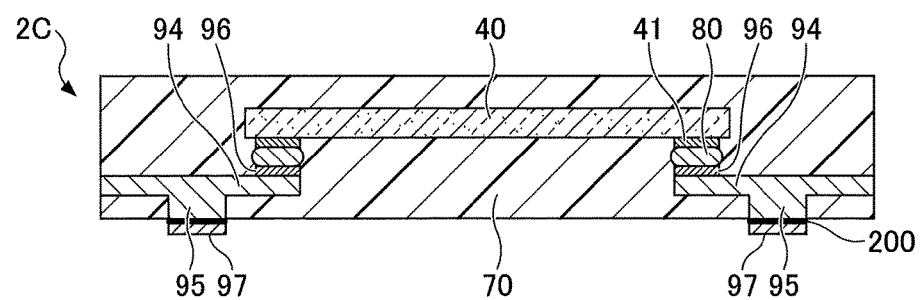

Next, in a step illustrated in FIG. 23C and FIG. 23D, by cutting the structure illustrated in FIG. 23B at cut positions C to be individualized, a plurality of semiconductor devices 2C are completed. The structure may be cut by a slicer or the like, for example.

Figure 24:
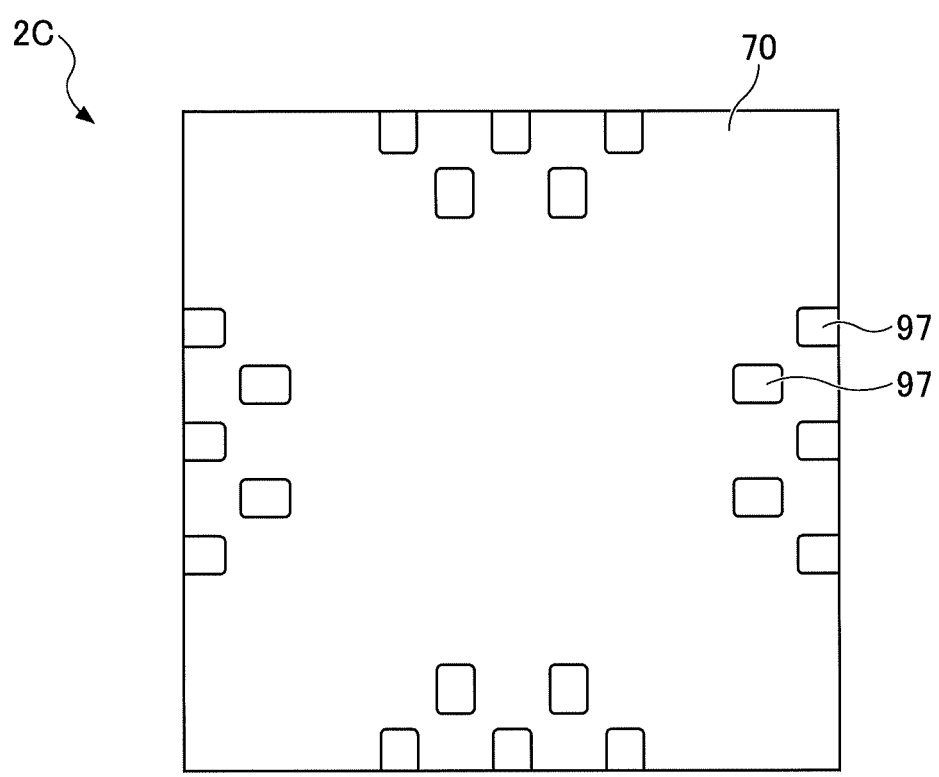
FIG. 24 is a view illustrating an example of the manufacturing step of the semiconductor device of the second embodiment.

As such, the semiconductor device 2C in which the semiconductor chip 40 is flip-chip mounted on the unit lead frame 90 can be actualized. As illustrated in FIG. 24, at a lower surface of the semiconductor device 2C, the metal film 97 formed at the lower surface of each of the first connection terminals 93 and the second connection terminals 95 is exposed from the lower surface of the resin portion 70. These regions where the metal film 97 is formed may be used as external connection terminals.

Modified Example of Second Embodiment

In a modified example of the second embodiment, another example of the lead frame is described in which the lower surface side of the frame portion 91 is half-etched.

FIG. 25A and FIG. 25B are views illustrating an example of a unit lead frame 90A of the lead frame of the modified example of the second embodiment. FIG. 25A and FIG. 25B are cross-sectional views corresponding to FIG. 15A and FIG. 15B, respectively. A plan view of the unit lead frame 90A is same as that of FIG. 14A and FIG. 14B, and cross-sectional views of the unit lead frame 90A taken along the Y1-Y1 to Y5-Y5 lines are same as those of FIG. 16A to FIG. 16E, respectively.

With reference to FIG. 25A and FIG. 25B, the unit lead frame 90A is different from the unit lead frame 90 (see FIG. 15A, FIG. 15B and the like) in that the lower surface side of the frame portion 91 is half-etched.

In the modified example of the second embodiment, with reference to FIG. 17A and FIG. 17B, the resist 360 is patterned to expose the lower surface of the frame portion 91 as well. Then, by the manufacturing step of FIG. 17C and FIG. 17D, and FIG. 18A to FIG. 18E, the lower surface of the frame portion 91 is also half-etched.

In the unit lead frame 90A, as the lower surface of the frame portion 91 is half-etched, the frame portion 91 can be made thin, and the work affected layer 200 (see FIG. 15A, FIG. 15B and the like) formed at the lower surface of the frame portion 91 is also removed by etching. Thus, the surface areas of the work affected layer existing regions at the upper surface and the lower surface of the frame portion 91, the first leads 92, the second leads 94, the first connection terminals 93 and the second connection terminals 95 are furthermore approximated. Accordingly, the residual stresses of the work affected layers 200 are furthermore balanced, and warpage of unit lead frame 90 can be furthermore reduced.

Example

A plate material made of C194 having a longitudinal size of 80 mm×a lateral size of 250 mm×a thickness of 0.127 mm was prepared as a sample, and the manufacturing steps of FIG. 4A to FIG. 5B of the first embodiment were performed. Then, in the manufacturing step of FIG. 5C, the sample having the structure illustrated in FIG. 5B was immersed in chemical polishing solution constituted by cupric chloride aqueous solution for 20 seconds at room temperature. By this manufacturing step, the work affected layer 200 formed at the lower surface of the plate portion 31 was removed. Thereafter, the sample was washed by hydrochloric acid and water, and the resist 320 was removed. Further, after washing the sample by sulfuric acid and water, the sample was dried to obtain the structure illustrated in FIG. 5D. Six samples were manufactured similarly.

As a comparative example, six samples were manufactured. Each of the samples of the comparative example was manufactured similarly as that of the example except that the step of FIG. 5C (removing the work affected layer 200 at the lower surface of the plate portion 31) was not performed.

For measuring a warpage amount, each of the samples of the example and the comparative example was placed on a surface plate while facing a protruding side downward, and a warpage amount of an end portion (a floating amount from the surface plate) of each of the samples was measured using a non-contact depth measuring microscope (a microscope using an optical type focal point detection system). Results are illustrated in Table 1.

TABLE 1

|  | EXAMPLE | COMPARATIVE EXAMPLE |
| --- | --- | --- |
| MATERIAL | C194 (80 mm × 250 mm × 0.127 mm) | C194 (80 mm × 250 mm × 0.127 mm) |

TABLE 1-continued

|  | EXAMPLE | COMPARATIVE EXAMPLE |
| --- | --- | --- |
| SHAPE OF PRODUCT | ONE SIDE HALF-ETCHED LEAD FRAME | ONE SIDE HALF-ETCHED LEAD FRAME |
| NUMBER OF SAMPLES | 6 | 6 |
| POST-TREATMENT CONDITION | IMMERSED IN CUPRIC CHLORIDE AQUEOUS SOLUTION FOR 20 SECONDS | NONE |
| WARPAGE AMOUNT | MAXIMUM VALUE 1.0 mm MINIMUM VALUE 0 mm AVERAGE VALUE 0.25 mm | MAXIMUM VALUE 3.5 mm MINIMUM VALUE 1.0 mm AVERAGE VALUE 1.75 mm |

As illustrated in Table 1, among the six samples of the example, the maximum value of the warpage amount was 1.0 mm, the minimum value of the warpage amount was 0 mm, and the average value of the warpage amount was 0.25 mm. Meanwhile, among the six samples of the comparative example, the maximum value of the warpage amount was 3.5 mm, the minimum value of the warpage amount was 1.0 mm and the average value of the warpage amount was 1.75 mm.

It can be considered that, as the work affected layer 200 at the lower surface of the plate portion 31 was removed for the samples of the example, surface areas of the work affected layer existing regions at the upper surface and the lower surface of the plate portion 31 were approximated, the residual stresses of the work affected layers 200 at the upper surface and the lower surface of the plate portion 31 were balanced, and warpage of the unit lead frames 30 was reduced compared with the comparative example.

According to the disclosure, warpage of a lead frame can be reduced.

Although a preferred embodiment of the lead frame and the method of manufacturing the lead frame has been specifically illustrated and described, it is to be understood that minor modifications may be made therein without departing from the spirit and scope of the invention as defined by the claims.

The present invention is not limited to the specifically disclosed embodiments, and numerous variations and modifications may be made without departing from the spirit and scope of the present invention.

Various aspects of the subject-matter described herein are set out non-exhaustively in the following numbered clauses:

1. A method of manufacturing a lead frame, including:
forming a plate portion having a first surface and a second surface that is opposite to the first surface, and a protruding portion that is protruded from the first surface of the plate portion, by etching a metal plate including work affected layers respectively formed at both opposing surfaces, the protruding portion being formed such that the work affected layer is left at a front end surface of the protruding portion, the plate portion being formed such that the work affected layer is removed at a region of the first surface at which the protruding portion is not formed;
removing at least a part of the work affected layer formed at the second surface of the plate portion by etching the second surface of the plate portion.

2. The method of manufacturing the lead frame according to clause 1, wherein in the removing the at least the part of the work affected layer formed at the second surface of the plate portion, the entirety of the work affected layer formed at the second surface of the plate portion is removed, the method further including, after the removing the at least the part of the work affected layer formed at the second surface of the plate portion:

forming a first metal film on the work affected layer formed at the front end surface of the protruding portion; and forming a second metal film on a region of the second surface of the plate portion at which the work affected layer is not formed.

3. The method of manufacturing the lead frame according to clause 1, further including, before the removing the at least the part of the work affected layer formed at the second surface of the plate portion:

forming a first metal film on the work affected layer formed at the front end surface of the protruding portion; and forming a second metal film on the work affected layer formed at the second surface of the plate portion, wherein in the removing the at least the part of the work affected layer formed at the second surface of the plate portion, the work affected layer at a region of the second surface of the plate portion at which the second metal film is not formed is removed.

4. The method of manufacturing the lead frame according to clause 2, wherein the second metal film is formed at a region of the second surface of the plate portion that overlaps the first metal film in a planar view.

5. The method of manufacturing the lead frame according to clause 3, wherein the second metal film is formed at a region of the second surface of the plate portion that overlaps the first metal film in a planar view.

What is claimed is:

1. A lead frame, comprising:
   a plate portion provided with a first surface and a second surface, the second surface being opposite to the first surface;
   a protruding portion integrally formed with the plate portion to be protruded from the first surface of the plate portion,
   wherein a surface of the lead frame includes
      a work affected layer existing region at which a work affected layer is formed, and
      a work affected layer non-existing region at which a work affected layer is not formed,
   wherein a front end surface of the protruding portion is the work affected layer existing region,
   wherein a region of the first surface at which the protruding portion is not formed is the work affected layer non-existing region, and
   wherein the second surface of the plate portion includes the work affected layer non-existing region.

2. The lead frame according to claim 1, further comprising:
   a first metal film formed on the work affected layer existing region of the front end surface of the protruding portion; and
   a second metal film formed on the second surface of the plate portion.

3. The lead frame according to claim 2, wherein the second metal film is formed at a region of the second surface of the plate portion overlapping the first metal film in a planar view.

4. The lead frame according to claim 1, wherein the entirety of the second surface of the plate portion is the work affected layer non-existing region.

5. The lead frame according to claim 2,
   wherein the second surface of the plate portion includes the work affected layer existing region, and
   wherein the second metal film is formed on the work affected layer existing region of the second surface.

6. The lead frame according to claim 5, wherein a region of the second surface at which the second metal film is not formed is the work affected layer non-existing region.

* * * * *